United States Patent
Lee et al.

(10) Patent No.: US 8,557,651 B2
(45) Date of Patent: Oct. 15, 2013

(54) METHOD OF MANUFACTURING A SEMICONDUCTOR DEVICE USING AN ETCHANT

(75) Inventors: Hyo-San Lee, Suwon-si (KR); Bo-Un Yoon, Seoul (KR); Kun-Tack Lee, Suwon-si (KR); Hag-Ju Cho, Hwaseong-si (KR); Sang-Jin Hyun, Suwon-si (KR); Hoon-Joo Na, Hwaseong-si (KR); Hyung-Seok Hong, Seoul (KR)

(73) Assignee: Samsung Electronics Co., Ltd., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 13/040,472

(22) Filed: Mar. 4, 2011

(65) Prior Publication Data

US 2011/0217833 A1  Sep. 8, 2011

(30) Foreign Application Priority Data

Mar. 4, 2010  (KR) .................. 10-2010-0019502

(51) Int. Cl.
 *H01L 21/8238* (2006.01)
(52) U.S. Cl.
 USPC ........... 438/216; 438/275; 438/287; 438/591; 257/410; 257/411
(58) Field of Classification Search
 USPC .......... 438/216, 275, 287, 591; 257/324, 325, 257/392, 406, 410, 411
 See application file for complete search history.

(56) References Cited

U.S. PATENT DOCUMENTS

| | | | |
|---|---|---|---|
| 5,981,401 A * | 11/1999 | Torek et al. .................. | 438/745 |
| 7,586,159 B2 | 9/2009 | Lee et al. | |
| 7,696,552 B2 | 4/2010 | Youn et al. | |
| 8,298,751 B2 * | 10/2012 | Hinsberg et al. .............. | 430/313 |
| 2006/0172907 A1 * | 8/2006 | Kim et al. ..................... | 510/175 |
| 2007/0218668 A1 * | 9/2007 | Wagener ....................... | 438/591 |
| 2010/0148280 A1 * | 6/2010 | Mitsuhashi .................. | 438/591 |
| 2010/0207214 A1 * | 8/2010 | Chuang et al. ................ | 438/216 |

FOREIGN PATENT DOCUMENTS

| | | |
|---|---|---|
| JP | 2003-309188 | 10/2003 |
| KR | 10-2007-0002864 A | 1/2007 |
| KR | 10-2007-0017756 A | 2/2007 |

OTHER PUBLICATIONS

Jung, H. S. et al, 'Dual High-k Gate Dielectric Technology Using Selective AlOx Etch (SAE) Process with Nitrogen and Fluorine Incorporation,' 2006 Symposium on VLSI Technology Digest of Technical Papers.*

* cited by examiner

*Primary Examiner* — Fernando L Toledo
*Assistant Examiner* — Bryan Junge
(74) *Attorney, Agent, or Firm* — Muir Patent Consulting, PLLC

(57) ABSTRACT

In an etchant for etching a capping layer having etching selectivity with respect to a dielectric layer, the capping layer changes compositions of the dielectric layer, to thereby control a threshold voltage of a gate electrode including the dielectric layer. The etchant includes about 0.01 to 3 percent by weight of an acid, about 10 to 40 percent by weight of a fluoride salt and a solvent. Accordingly, the dielectric layer is prevented from being damaged by the etching process for removing the capping layer and the electric characteristics of the gate electrode are improved.

19 Claims, 18 Drawing Sheets

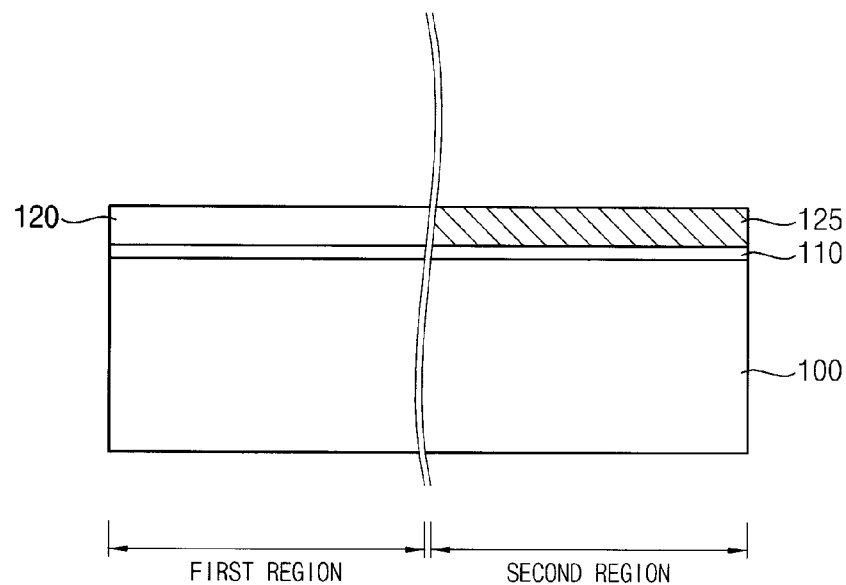
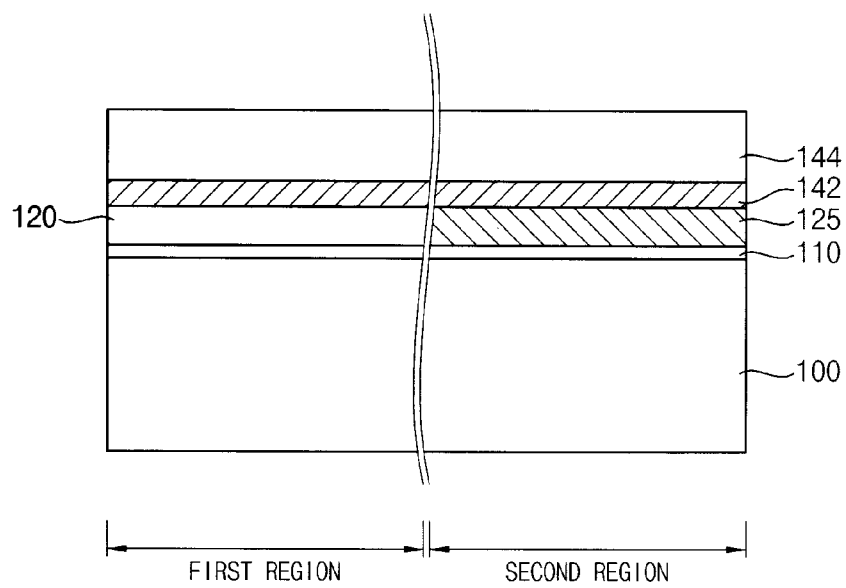

METHOD OF MANUFACTURING A SEMICONDUCTOR DEVICE USING AN ETCHANT

CROSS-REFERENCE TO RELATED APPLICATIONS

This U.S. non-provisional patent application claims priority under 35 U.S.C. §119 from Korean Patent Application No. 10-2010-0019502 filed in the Korean Intellectual Property Office on Mar. 4, 2010, in the Korean Intellectual Property Office, the disclosure of which is incorporated herein in its entirety by reference.

BACKGROUND

1. Field

Examples relate to an etchant, a method of forming a gate insulation layer using the etchant and a method of manufacturing a semiconductor device using the etchant. More particularly, examples relate to an etchant that reduces damage to the gate insulation layer, a method of forming the gate insulation layer using the etchant and a method of manufacturing a semiconductor device using the etchant.

2. Description of the Related Art

As the degree of integration of semiconductor devices increases, a gate electrode of the semiconductor device has been downsized and a channel region under the gate electrode has been also shortened. Thus, the gate insulation layer in recent semiconductor devices tends to be formed to a small thickness so as to increase the capacitance between the gate electrode and the channel and to improve operation characteristics of transistors. However, when the gate insulation layer comprises conventional materials such as silicon oxide and silicon oxynitride, the thickness reduction of the gate insulation layer can cause electric failures and deterioration of the reliability of the gate insulation layer. That is, when a silicon oxide layer or a silicon oxynitride layer is formed to a small thickness as the gate insulation layer, direct tunneling currents are increased through the gate insulation layer and thus a leakage current is frequently generated between the gate electrode and the channel under the gate electrode. For these reasons, intensive research has been conducted on dielectric layers having a high dielectric constant which can be used in place of the conventional silicon oxide layer or the silicon oxynitride layer.

SUMMARY

Examples of the present inventive concept provide an etchant for a wet etching process which may cause minimal or no damage to a gate insulation layer for a semiconductor device.

Other examples of the present inventive concept provide a method of manufacturing a semiconductor device using the above etchant.

According to some examples, there is provided an etchant having etching selectivity with respect to a dielectric layer. The etchant may comprise about 0.01 to 3 percent by weight of an acid, about 10 to 40 percent by weight of a fluoride salt and a solvent.

In an example, the etchant may further comprise about 0.01 to about 1 percent by weight of a surfactant. The acid may include any one selected from the group consisting of hydrochloric acid, sulfuric acid, nitric acid and phosphoric acid, fluoric acid and combinations thereof. The fluoride salt may include any one selected from the group consisting of potassium difluoride ($KHF_2$), ammonium fluoride ($NH_4F$), ammonium difluoride ($NH_4HF_2$), hydrogen fluoride pyridine and combinations thereof. In addition, the dielectric layer may include any one material selected from the group consisting of hafnium oxide (HfOx), hafnium silicon oxide (HfSiO), hafnium silicon oxynitride (HfSiON), hafnium aluminum oxide (HfAlO), titanium oxide (TiOx), aluminum titanium oxide (AlTiO) and combinations thereof.

According to other examples, there is provided a method of manufacturing a semiconductor device. An interface layer may be formed on a substrate having a first region and a second region and then a dielectric layer may be formed on the interface layer. The interface layer may comprise a material having a dielectric constant smaller than about 4. A capping layer may be formed on the dielectric layer. A capping layer pattern may be formed on the dielectric layer by etching the capping layer using an etchant from one of the first and the second regions of the substrate. The etchant may include about 0.01 to 3 percent by weight of an acid, about 10 to 40 percent by weight of a fluoride salt and a solvent. A composition of the dielectric layer underlying the capping layer pattern may be changed by a heat treatment to the capping layer pattern at one of the first and the second regions of the substrate, so that the dielectric layer include a first dielectric layer of which the composition is unchanged and a second dielectric layer of which the composition is changed by the heat treatment.

In an example, the dielectric layer may include any one material selected from the group consisting of hafnium oxide (HfOx), hafnium silicon oxide (HfSiO), hafnium silicon oxynitride (HfSiON), hafnium aluminum oxide (HfAlO), titanium oxide (TiOx), aluminum titanium oxide (AlTiO) and combinations thereof. For example, the dielectric layer may have a dielectric constant of at least about 10.

In an example, the capping layer may be etched at an etch rate at least about 3 times greater than the etch rate of the dielectric layer. For example, the etchant may have an etch selectivity with respect to the dielectric layer such that the capping layer is etched at an etch rate at least 5 times, and more particularly, at least 10 times, greater than the dielectric layer.

In an example, the composition of the second dielectric layer may be changed by one of permeation from the capping layer pattern and reaction with the capping layer pattern.

In an example, the capping layer pattern may be removed from the second dielectric layer pattern and a gate electrode layer may be formed on the first and second dielectric layers. Then, the gate electrode layer may be sequentially patterned, thereby forming a first gate structure on the first region of the substrate and a second gate structure on the second region of the substrate. For example, the gate electrode layer may comprise a metal nitride.

In an example, an insulation interlayer may be further formed on the substrate. The insulation interlayer may include a plurality of openings through which the substrate is partially exposed, wherein the first and the second gate structures are formed in the openings, respectively.

In an example, the first region may include an NMOS region on which an N-channel MOS transistor is formed and the second region may include a PMOS region on which a P-channel MOS transistor is formed, and the capping layer may include any one material selected from the group consisting of aluminum nitride, aluminum oxide, dysprosium oxide, lanthanum oxide, silicon oxide and combinations thereof, so that the capping layer in the NMOS region may be selectively removed and the capping layer pattern is formed in the PMOS region.

In an example, the first region may include an NMOS region on which an N-channel MOS transistor is formed and the second region may include a PMOS region on which a P-channel MOS transistor is formed, and the capping layer may include lanthanum oxide, so that the capping layer in the PMOS region may be selectively removed and the capping layer pattern is formed in the NMOS region.

In an example, the etchant may further include about 0.01 to about 1 percent by weight of a surfactant. The acid may include any one selected from the group consisting of hydrochloric acid, sulfuric acid, nitric acid and phosphoric acid, fluoric acid and combinations thereof. The fluoride salt may include any one selected from the group consisting of potassium difluoride ($KHF_2$), ammonium fluoride ($NH_4F$), ammonium difluoride ($NH_4HF_2$), hydrogen fluoride pyridine and combinations thereof.

In an example, before forming the capping layer pattern, a silicon oxide layer pattern may be further formed on the capping layer in such a manner that the capping layer is partially exposed through the silicon oxide layer pattern at one of the first and the second regions of the substrate, so that the silicon oxide layer pattern is positioned on the capping layer pattern. Then, the silicon oxide layer pattern may be removed from the capping layer pattern and a composition of the dielectric layer under the capping layer pattern may be changed by a heat treatment to the capping layer pattern at one of the first and the second regions of the substrate.

According to some examples of the present inventive concept, a pair of gate insulation layers of which the electric polarities are opposite to each other may be simultaneously formed on a substrate without any damage to a high-k layer caused by an etchant for removing a capping layer. Thus, the gate electrodes having the gate insulation layers may have different effective work function, and thus the threshold voltages of a CMOS transistor may be easily controlled by modifications of the compositions of the gate insulation layer. In addition, the current leakage of the CMOS transistor can be sufficiently reduced by modifications of the compositions of the gate insulation layer.

BRIEF DESCRIPTION OF THE DRAWINGS

Examples will be more clearly understood from the following detailed description taken in conjunction with the accompanying drawings.

FIGS. 1 to 10 are cross-sectional views illustrating processing steps for a method of manufacturing a semiconductor device in accordance with an example of the present inventive concept;

DETAILED DESCRIPTION OF THE EMBODIMENTS

Figure 1:
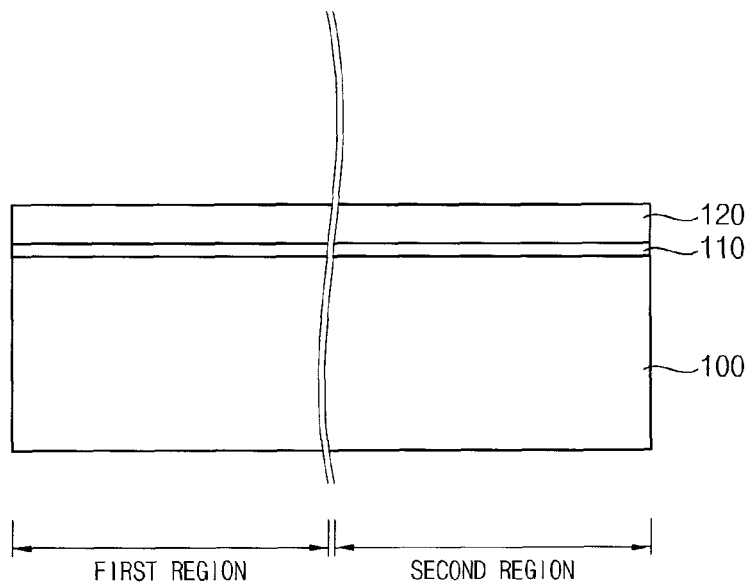

Various examples will be described more fully hereinafter with reference to the accompanying drawings, in which some examples are shown. The present invention may, however, be embodied in many different forms and should not be construed as limited to the examples set forth herein. Rather, these examples are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples are described herein with reference to cross-sectional illustrations that are schematic illustrations of idealized examples (and intermediate structures). As such, variations from the shapes of the illustrations as a result, for example, of manufacturing techniques and/or tolerances, are to be expected. Thus, examples should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples will be explained in detail with reference to the accompanying drawings.

FIGS. 1 to 10 are cross-sectional views illustrating processing steps for a method of manufacturing a semiconductor device in accordance with an example of the present inventive concept.

Referring to FIG. 1, a semiconductor substrate 100 such as a silicon wafer may be prepared for manufacturing the semiconductor device. The semiconductor substrate 100 may include a first region and a second region. For example, the first region of the substrate 100 may include a NMOS region on which an N type transistor may be formed and the second region of the substrate 100 may include a PMOS region on which a P type transistor may be formed.

An interface layer 110 may be formed on the first and the second regions of the substrate 100 to a thickness of about 0.2 Å to about 15 Å. The interface layer 110 may prevent an unexpected boundary layer between the substrate 100 and a dielectric layer comprising a material of a high dielectric constant k (hereinafter, referred to as high-k) that may be formed on the interface layer 110 in a subsequent process. For example, the interface layer 110 may include a low-k material layer having a dielectric constant below about 4, and preferably below about 3, such as a silicon nitride layer and a silicon oxynitride layer In addition, the dielectric layer may also include a silicate layer. Those examples of the interface layer 110 may be used alone or in combinations thereof.

The substrate 100 may be cleaned up by ozone (O3) gas or ozone water before forming the interface layer 110 on the substrate 100.

A first high-k layer 120 may be formed on the interface layer 110. For example, the high-k layer may comprise hafnium oxide (HfOx), hafnium silicon oxide (HfSiO), hafnium silicon oxynitride (HfSiON), hafnium aluminum oxide (HfAlO), titanium oxide (TiOx), aluminum titanium oxide (AlTiO) and combinations thereof. The high-k dielectric preferably may have a dielectric constant larger than 9. Alternatively, the high-k dielectric may have a dielectric constant larger than 10, or larger than 20. The high-k layer also may be selected from a group comprising of aluminum oxide (Al2O3), hafnium oxynitride (HfON), hafnium silicate (HfSiO4), zirconium oxide (ZrO2), zirconium oxynitride (ZrON), zirconium silicate (ZrSiO4), Ta2O5, Y2O3, Nb2O5, TiO2, CeO2, In2O3, RuO2, MgO, SrO, B2O3, SnO2, PbO, PbO2, Pb3O4, V2O3, La2O3, Pr2O3, Sb2O3, Sb2O3, Sb2O5, CaO, etc., or combinations thereof.

In the present example, the hafnium oxide (HfOx) layer may be formed on the interface layer 110 to a thickness of about 0.2 Å to about 50 Å as the first high-k layer 120. Particularly, the hafnium oxide (HfOx) layer may be formed to a thickness of about 5 Å to about 50 Å.

The hafnium oxide (HfOx) layer may be formed on the interface layer 110 by a CVD (chemical vapor deposition) process or an ALD (atomic layer deposition) process. The CVD process for forming the hafnium oxide (HfOx) layer may be performed at a temperature of about 400° C. to about 500° C. under pressure of about 1 Torr to about 5 Torr using hafnium (Hf) sources of HfCl4, Hf(OtBu)4, Hf(NEtMe)4, Hf(MMP)4, Hf(NEt2)4 and Hf(NMe2)4 and using oxygen (O) sources of oxygen (O2) gas, ozone (O3) gas and oxygen radicals.

The ALD process sequentially applies precursor materials (e.g., a hafnium source precursor and an oxygen source precursor) separated by a purging step. The ALD process for forming the hafnium oxide (HfOx) layer may be performed at a temperature of about 150° C. to about 500° C. under pressure of about 0.1 Torr to about 5 Torr using hafnium (Hf) sources of metal organic precursors such as HfCl4, Hf(OtBu)4, Hf(NEtMe)4, Hf(MMP)4, Hf(NEt2)4 and Hf(NMe2)4 and using oxygen (O) sources of water vapor (H2O), hydrogen peroxide (H2O2), alcohol-based materials including —OH radical, ozone (O3) or oxygen (O2) plasma. In the ALD process, a deposition process and a purging process may be repeated until the hafnium oxide (HfOx) layer has a desired thickness. The ALD process has advantages of a low-temperature deposition, an excellent step coverage and easy thickness control.

In addition, the hafnium oxide (HfOx) layer may become dense by an annealing process in an atmosphere of a gas including nitrogen (N). Examples of the gases including nitrogen atom may include nitrogen (N2) gas, nitrogen monoxide (NO) gas, nitrous oxide (N2O) gas and ammonium (NH3) gas. These may be used alone or in combinations thereof. Otherwise, the hafnium oxide (HfO2) layer may become dense by an annealing process in a vacuum atmosphere without any gases.

The annealing process may be performed at a temperature of about 750° C. to about 1050° C. The annealing process to the hafnium oxide (HfOx) layer may reduce an etching rate of the hafnium oxide (HfOx) layer against an etchant for a wet etching process, particularly, against an etchant including fluorine (F). When the annealing process may be performed under a temperature of about 750° C., the etching rate of the hafnium oxide (HfOx) layer may be insufficiently reduced. In contrast, when the annealing process may be performed over a temperature of about 1050° C., the hafnium oxide (HfOx) layer may be excessively crystallized and thus a leakage current tends to increase through the crystallized hafnium oxide (HfOx) layer. Thus, although the annealing process may be performed at other temperatures, the temperature of about 750° C. to about 1050° C. will be typically maintained for annealing the hafnium oxide (HfOx) layer.

Figure 2:
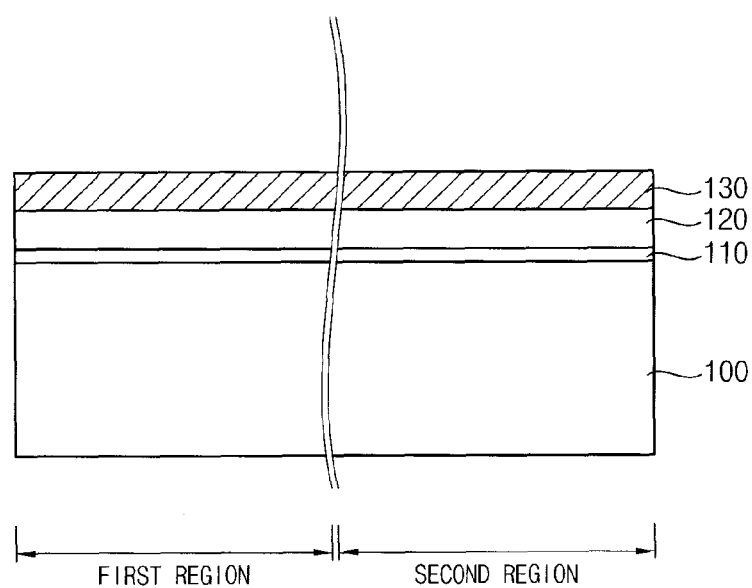

Referring to FIG. 2, a capping layer 130 may be formed on the first high-k layer 120. The capping layer may include a single layer of aluminum nitride (AlNx), aluminum oxide (AlOx), dysprosium oxide (DyOx) and silicon oxide (SiOx) or a multilayer thereof. The capping layer 130 may change compositions of the first high-k layer 120 and thus the first high-k layer 120 may be changed to a gate insulation layer having a sufficient effective work function for a PMOS transistor.

In the present example, an aluminum oxide (Al2O3) layer may be formed on the first high-k layer 120 to a thickness below about 50 Å as the capping layer 130. The aluminum oxide (Al2O3) layer may be formed to a thickness of about 0.2 Å to about 50 Å, and particularly, of about 5 Å to about 50 Å.

The aluminum oxide (Al2O3) layer may be formed by a deposition process such as a CVD process and an ALD process, and in the present example, may be formed by an ALD process. The ALD process for forming the aluminum oxide (Al2O3) layer may be performed at a temperature of about 200° C. to about 500° C. under pressure of about 0.1 Torr to about 5 Torr using a first reactant of tri-methyl aluminum (TMA) and using a second reactant of ozone (O3) gas. In the ALD process, a deposition process and a purging process may be repeated until the aluminum oxide (Al2O3) layer may have a desired thickness. The ALD process has advantages of a low-temperature deposition, an excellent step coverage and easy thickness control. Aluminum combinations such as AlCl3, AlH3N(CH3)3, C6H5AlO, (C4H9)2AlH, (CH3)3AlCl, $(C_2H_5)_3Al$ and $(C_4H_9)_3Al$ may also be used as the first reactant as well as TMA. In addition, activated oxidizing agents such as H2O, H2O2, N2O plasma and O2 plasma may also be used as the second reactant as well as the ozone (O3) gas. A subsequent annealing process may be omitted in case that ozone (O3) gas may be used as the second reactant of the ALD process.

Further, an annealing process may be performed on the capping layer 130 in an atmosphere of a gas including nitrogen (N). Examples of the gases including nitrogen atom may include nitrogen (N2) gas, nitrogen monoxide (NO) gas, nitrous oxide (N2O) gas and ammonium (NH3) gas. These may be used alone or in combinations thereof. Otherwise, the annealing process may be performed in a vacuum atmosphere without any gases.

The annealing process may be performed at a temperature of about 400° C. to about 950° C., and particularly, of about 650° C. to about 850° C. The annealing process to the capping layer 130 may reduce an etching rate of the capping layer 130 against a stripper for stripping a photoresist film in a subsequent process.

Figure 3:
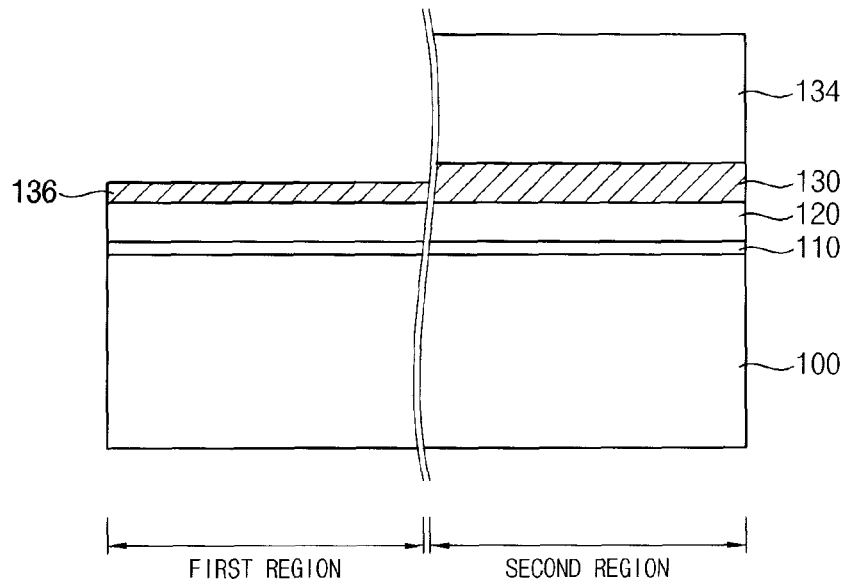

Referring to FIG. 3, a photoresist pattern 134 may be formed on the capping layer 130 in such a configuration that the capping layer 130 in the first region may be exposed and the capping layer 130 in the second region may be covered with the photoresist pattern 134. For example, a photoresist film (not illustrated) may be formed on a whole surface of the capping layer 130 across the first and the second regions and a portion of the photoresist film corresponding to the first region may be removed from the capping layer 130 by an exposure and development process. Thus, the photoresist film may remain just only on the capping layer 130 corresponding to the second region to thereby form the photoresist pattern 134 covering the capping layer 130 corresponding to the second region of the substrate 100. When the photoresist film is removed from the capping layer 130 corresponding to the first region of the substrate 100, an upper portion of the capping layer 130 may also be removed off together with the photoresist film, thereby forming a reduced capping layer 136 with a reduced thickness on the first high-k layer 120 in the first region.

Figure 4:
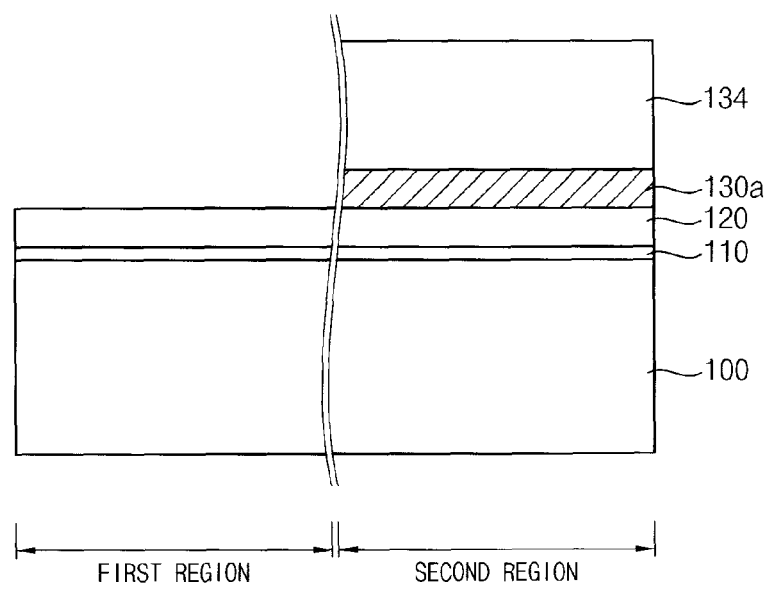

Referring to FIG. 4, the reduced capping layer 136 may be removed from the first high-k layer 120 corresponding to the first region and thus the capping layer 130 may remain merely on the first high-k layer 120 corresponding to the second region, thereby forming a capping layer pattern 130a on the high-k layer 120.

For example, the reduced capping layer 136 may be removed from first high-k layer 120 by a wet etching process. An etchant for the wet etching process may include a water mixture of an acid of about 0.01% by weight (weight percent, hereinafter designated as wt %) to about 3 wt %, fluoride salt of about 10 wt % to about 40 wt % and de-ionized water. The etchant may further include a surfactant of about 0 wt % to about 1.0 wt %. In another example, a water mixture of an acid of from 0.01 to 3.0 wt %, halogen (e.g. fluoride) salt of from 10 to 40 wt % is provided, or such an acid and fluoride salt along with deionized water and a surfactant of 0 to 1.0 wt %. The acid may be dissociated into hydrogen ions in the water mixture. Examples of the acid may include hydrochloric acid, sulfuric acid, nitric acid and phosphoric acid as well as fluoric acid. The acid may be provided in other amounts such as from 0.05 to 2 wt %, or from 0.1 to 1.0 wt %. The fluoride salt may be dissociated into fluoride ions (F—) or difluoride ions (HF2-) in the water mixture. Examples of the fluoride salt may include potassium difluoride ($KHF_2$), ammonium fluoride ($NH_4F$), ammonium bifluoride ($NH_4HF_2$) and hydrogen fluoride pyridine. The fluoride salt may be provided in other amounts, such as from 10 to 35 wt %, or from 15 to 30 wt %. The surfactant may include chemical compounds having both of a hydrophilic group of a fluorine-based material and a hydrophobic group of a silicon-based material.

In another example, the etchant may include an acid less than about 1 wt %. In such a case, the acid may rarely be included in the etchant for the wet etching process.

When the reduced capping layer 136 is removed from the first high-k layer in the first region by the wet etching process using the etchant, the photoresist pattern 134 and the first high-k layer 120 may only slightly etched off by the etchant. That is, the reduced capping layer 136 may have etching selectivity with respect to the photoresist pattern 134 and the first high-k layer 120.

Therefore, minimal or no damage may be substantially caused to the capping layer pattern 130a in the wet etching process for removing the reduced capping layer 136 since the capping layer pattern 130a may be covered with the photoresist pattern 134 in the second region of the substrate 100. Thus, the leakage current caused by defects of the capping layer pattern 130a and the first high-k layer 120 may be sufficiently prevented in the semiconductor device.

The wet etching process for removing the reduced capping layer 136 may be performed in a batch type etching apparatus in which a group of wafers may be dipped into the etchant or a single wafer type etching apparatus in which the etchant may be supplied onto a single rotating wafer.

Figure 5:
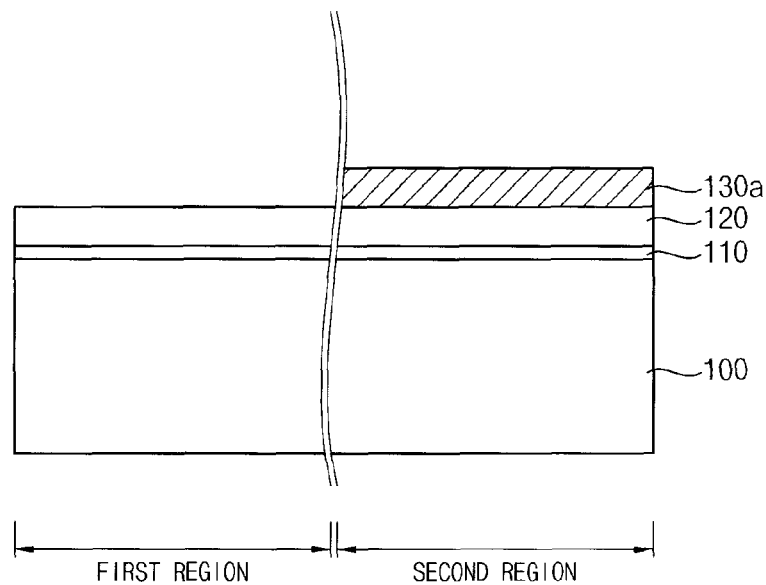

Referring to FIG. 5, the photoresist pattern 134 may be removed from the capping layer pattern 134 by an ashing process and/or a strip process. Otherwise, the photoresist pattern 134 may be removed from the capping layer pattern 134 by a wet cleaning process using an industrial thinner as a cleaning solution. Thus, the first high-k layer may be exposed in the first region of the substrate 100 and the capping layer pattern 130a may be exposed in the second region of the substrate 100. When an annealing process is performed on the capping layer pattern 130a, the etch resistance of the capping layer 130a may be improved and thus the capping layer pattern 130a may be prevented from being etched off by a stripper for stripping the photoresist pattern 134.

Figure 6:
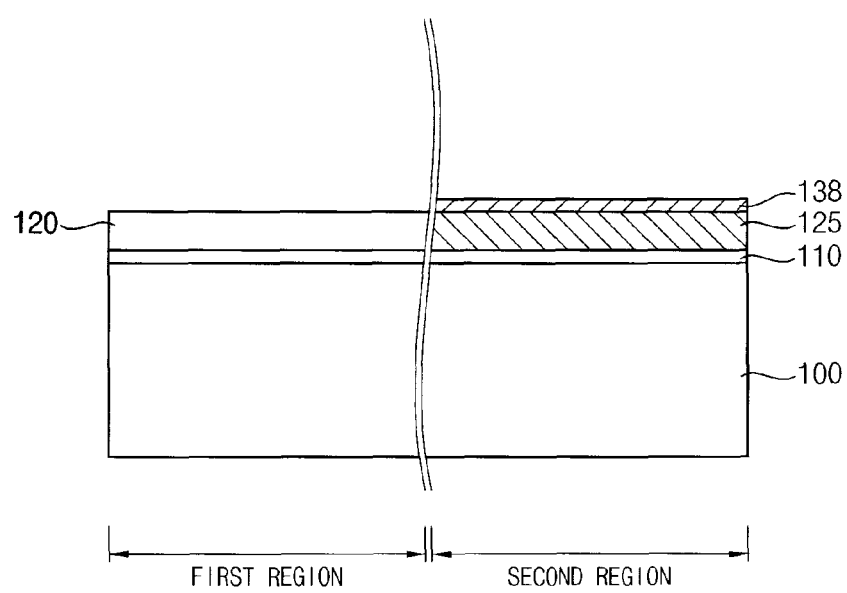

Referring to FIG. 6, an additional annealing process may be performed on the capping layer pattern 130a and the first high-k layer 120 in an atmosphere of a gas including nitrogen (N). Examples of the gases including nitrogen (N) may include N2 gas, NO gas, N2O gas and NH3 gas. These may be used alone or in combinations thereof. The additional annealing process may also be performed at a temperature of about 750° C. to about 1050° C. When the additional annealing process may be performed under a temperature of about 750° C., the gases including nitrogen (N) may be difficult to be activated and thus the high-k layer 120 and the capping layer pattern 130a may be difficult to become dense in spite of the annealing process. In contrast, when the additional annealing process may be performed over a temperature of about 1050° C., a leakage current tends to increase through the high-k layer 120 and the capping layer pattern 130a. Thus, although the embodiment contemplates an additional annealing process to be performed at other temperatures, the temperature of about 750° C. to about 1050° C. will be typically maintained when it is desired to anneal the high-k layer 120 and the capping layer pattern 130a.

The capping layer pattern 130a may become denser in the second region by the additional annealing process and thus may be protected from external impurities. In addition, rapid boundary variations may also be prevented between the first high-k layer 120 and the capping layer pattern 130a by the additional annealing process. For example, a metal alloy oxide (not illustrated) may be formed between the first high-k layer 120 and the capping layer pattern 130a. Alternatively, a portion of the composition or compositions of the capping layer pattern 130a may permeate into the first high-k layer 120 and thus the capping layer pattern 130a may be transformed into a reduced capping layer pattern 138 having a reduced thickness as compared to the thickness of the capping layer pattern 130a and the first high-k layer 120 may be transformed into a second high-k layer 125.

Surface damage of the first high-k layer 120 caused by the cleaning solution or the stripper may be cured by the additional annealing process in the first region of the substrate 100. In addition, a silicate layer (not illustrated) may be formed between the first high-k layer 120 and the interface layer 110 under a high temperature of the annealing process and thus the rapid boundary variations may also be prevented between the first high-k layer 120 and the interface layer 110.

While the present example discloses an annealing process for preventing the external impurities from permeating into the capping layer pattern 130a and the first high-k layer 120, any other processes known to one of the ordinary skill in the art may also be used in conjunction with or in place of the annealing process. For example, a plasma treatment in a nitrogen (N) atmosphere and a subsequent heat treatment in a vacuum or an oxygen atmosphere may also be used in place of the annealing process. In such a case, the high-k layer 120 may be firstly nitrified and then the nitrified high-k layer may experience the heat treatment.

Referring to FIG. 7, the reduced capping layer pattern 138 may be removed from the second high-k layer 125 by a cleaning process using the same cleansing solution described with reference to FIG. 4, and thus a gate insulation layer may have different electric characteristics at the first and the second regions of the substrate 100. That is, the first high-k layer 120 having electric characteristics for an NMOS transistor may be formed on the first region of the substrate 100 and the second high-k layer 125 having electric characteristics for a PMOS transistor may be formed on the second region of the substrate 100.

Referring to FIG. 8, a conductive layer 142 including a metal and a polysilicon layer 144 may be sequentially stacked on the first and the second high-k layers 120 and 125 across the first and the second regions of the substrate 100. For example, the conductive layer 142 may include a metal nitride layer and the metal of the metal nitride layer may include one of tungsten (W), molybdenum (Mo), titanium (Ti), tantalum (Ta), aluminum (Al), hafnium (Hf), zirconium (Zr) and silicon (Si). The conductive layer 142 may be formed on the first and second high-k layers 120 and 125 to a thickness of about 0.2 Å to about 500 Å. Particularly, the conductive layer 142 may be formed to a thickness of about of about 0.2 Å to about 50 Å in view of high degree of integration of a semiconductor device.

Since the first and the second high-k layers 120 and 125 may have different compositions, the conductive layer 142 may have different effective work function in accordance with the first region and the second region of the substrate 100. In the present example, the conductive layer 142 corresponding to the first region may have the effective work function of an NMOS transistor and the conductive layer 142 corresponding to the second region may have the effective work function of a PMOS transistor. Accordingly, the threshold voltage may be sufficiently applied to the NMOS and the PMOS transistors, respectively.

The polysilicon layer 144 may be formed on the conductive layer 142 to a thickness of about 1000 Å to about 1500 Å. In the present example, polysilicon may be used for forming a gate electrode of the semiconductor device.

Figure 9:
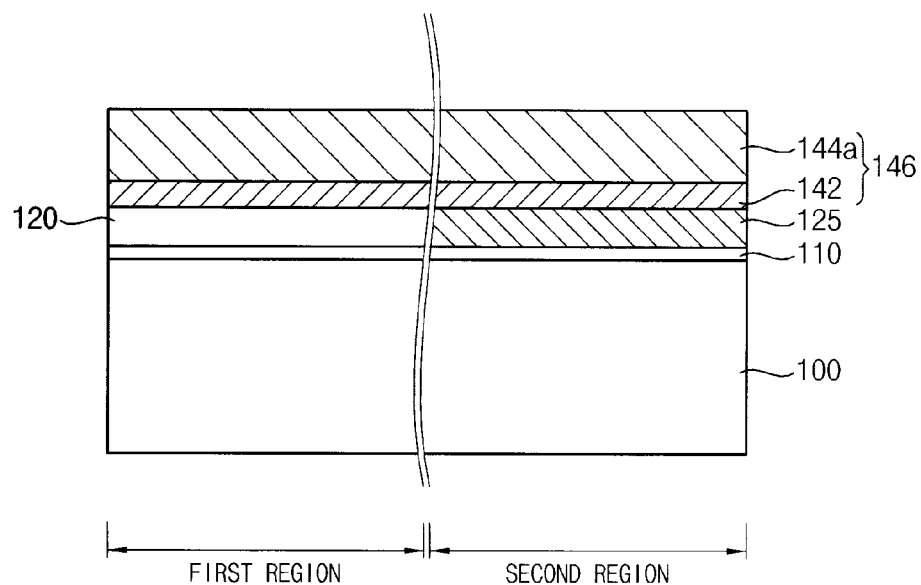

Referring to FIG. 9, impurities may be doped into the polysilicon layer 144, thereby converting the non-conductive polysilicon layer 144 to a conductive polysilicon layer 144a. Particularly, n-type impurities such as phosphorus (P) and arsenic (As) may be doped into the polysilicon layer 144 in the first region of the substrate 100 and p-type impurities such as boron (B) may be doped into the polysilicon layer in the second region of the substrate 100. Thus, the conductive layer 142 including metal and the conductive polysilicon layer 144a may be stacked on the high-k layers 120 and 125 across the first and second regions of the substrate 100, thereby forming a gate electrode layer 146 on the high-k layers 120 and 125.

Figure 10:
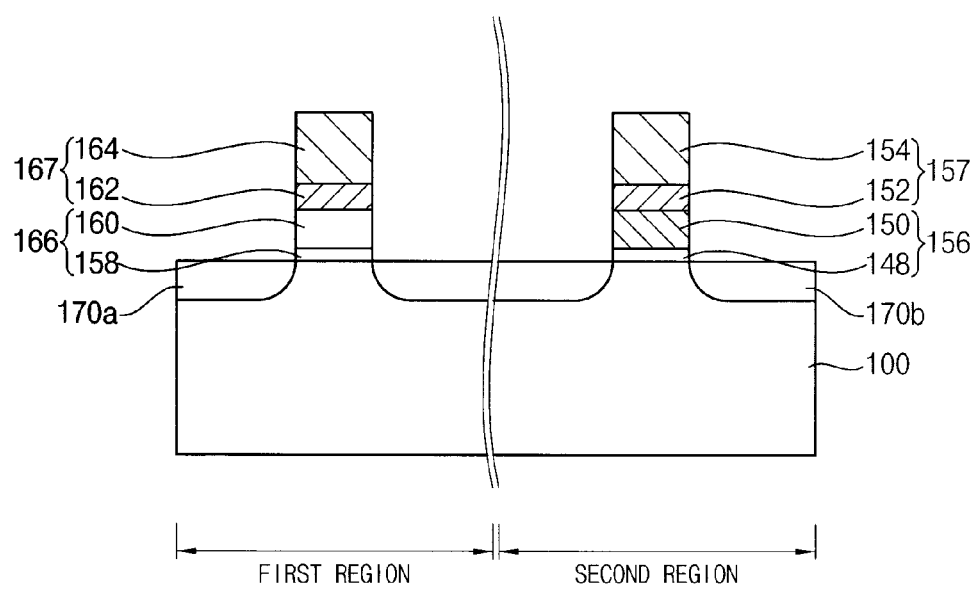

Referring to FIG. 10, the gate electrode layer 146, the first and the second high-k layers 120 and 125 and the interface layer 110 may be sequentially etched at the first and second regions of the substrate 100, and thus a first gate insulation pattern 166 and a first gate electrode pattern 167 may be formed on the first region of the substrate 100 and a second gate insulation pattern 156 and a second gate electrode pattern 157 may be formed on the second region of the substrate 100. Thereafter, n-type impurities may be implanted onto the first region of the substrate 100 to thereby form first source/drain regions 170a and p-type impurities may be implanted onto the second region of the substrate 100 to thereby form second source/drain regions 170b.

Accordingly, an NMOS transistor and a PMOS transistor may be formed on the first and the second regions of the substrate 100 with a sufficient threshold voltage, respectively. In addition, the gate electrode of the NMOS and the PMOS transistors may include the same metal nitride, thereby simplifying the manufacturing process of a semiconductor device having a CMOS transistor.

FIGS. 11 to 15 are cross-sectional views illustrating processing steps for a method of manufacturing a semiconductor device in accordance with an example.

The present example method of manufacturing a semiconductor device may be substantially the same as the manufacturing method of a semiconductor device described with reference to FIGS. 1 to 10, except that the capping layer may be removed from the second region of the substrate.

At first, an interface layer 110 and a first high-k layer 120 may be formed on a semiconductor substrate 100 substantially in the same process as described with reference to FIG. 1.

Figure 11:
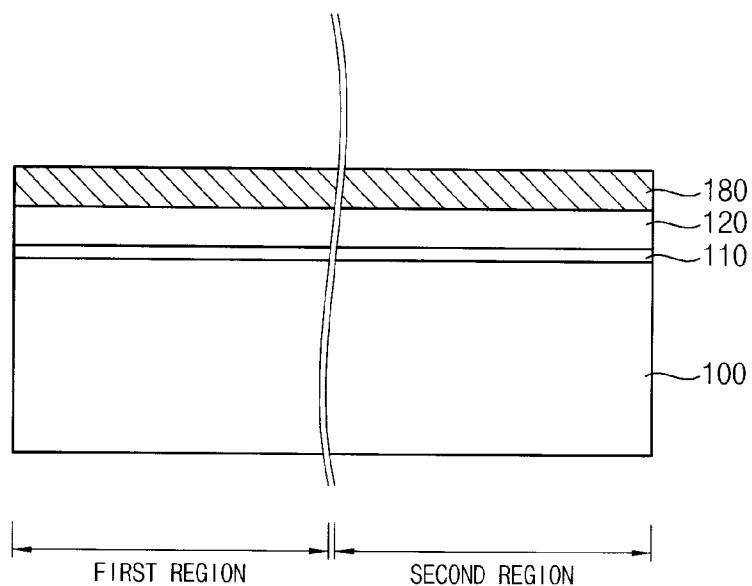
FIGS. 11 to 15 are cross-sectional views illustrating processing steps for a method of manufacturing a semiconductor device in accordance with an example of the present inventive concept.

Referring to FIG. 11, a capping layer 180 may be formed on the first high-k layer 120 and may include lanthanum oxide (LaOx) The capping layer 180 of lanthanum oxide may change compositions of the first high-k layer 120, and thus may change an effective work function of a gate electrode of an NMOS transistor.

Although not illustrated in figures, an annealing process may be performed on the capping layer 180 in an atmosphere of a gas including nitrogen (N). The annealing process may be performed substantially in the same manner as described with reference to FIG. 2.

Figure 12:
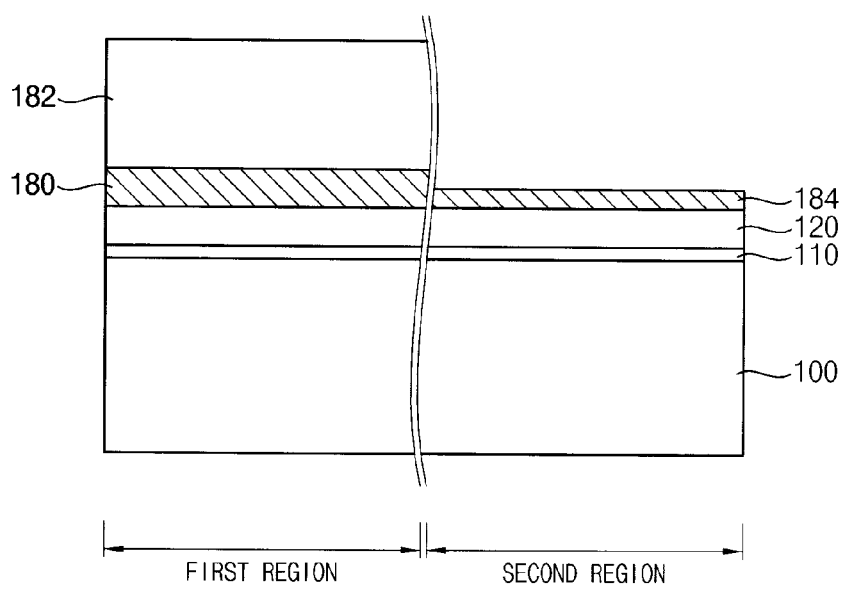

Referring to FIG. 12, a photoresist pattern 182 may be formed on the capping layer 180 in such a configuration that the capping layer 180 in the second region may be exposed and the capping layer 180 in the first region may be covered. For example, a photoresist film (not illustrated) may be formed on a whole surface of the capping layer 180 across the first and the second regions and a portion of the photoresist film corresponding to the second region may be removed from the capping layer 180 by an exposure and development process. Thus, the photoresist film may remain just only on the capping layer 180 corresponding to the first region to thereby form the photoresist pattern 182 covering the capping layer 180 corresponding to the first region of the substrate 100. When the photoresist film may be removed from the capping layer 180 corresponding to the second region of the substrate 100, an upper portion of the capping layer 180 may also be removed off together with the photoresist film, thereby forming a reduced capping layer 184 on the first high-k layer 120 in the second region.

Figure 13:
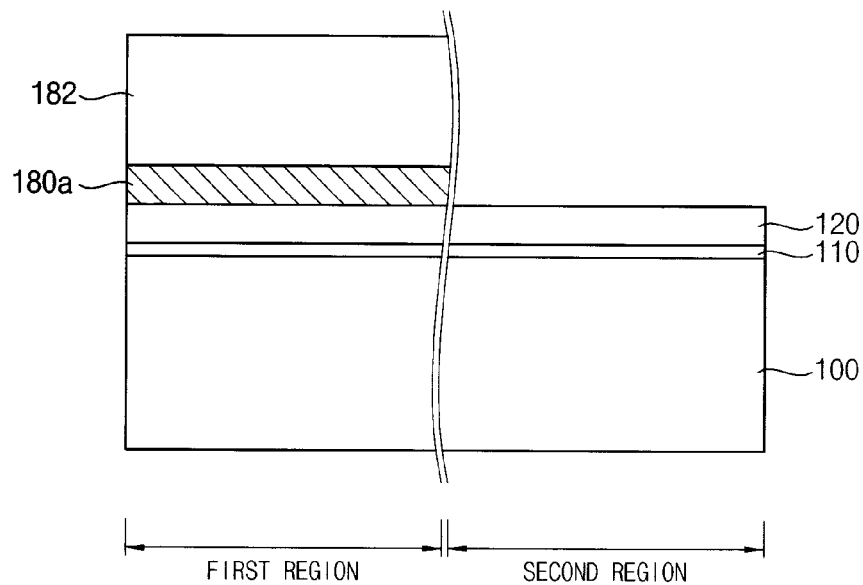

Referring to FIG. 13, the reduced capping layer 184 may be removed from the first high-k layer 120 corresponding to the second region of the substrate 100 and thus the capping layer 180 may remain merely on the first high-k layer 120 corresponding to the first region of the substrate 100, thereby forming a capping layer pattern 180a on the high-k layer 120 in the first region of the substrate 100. The reduced capping layer 184 may be removed from the first high-k layer 120 substantially by the same process as described with reference to FIG. 4. That is, the reduced capping layer 184 may be removed from the first high-k layer in the second region by the same wet etching process using the etchant as described with reference to FIG. 4, the first high-k layer 120 may be rarely etched off by the etchant. In addition, when the reduced capping layer 184 may be etched off by the etchant, minimal or no damage may be caused to the capping layer pattern 180a interposed between the photoresist pattern 182 and the high-k layer 120 in the first region.

Figure 14:
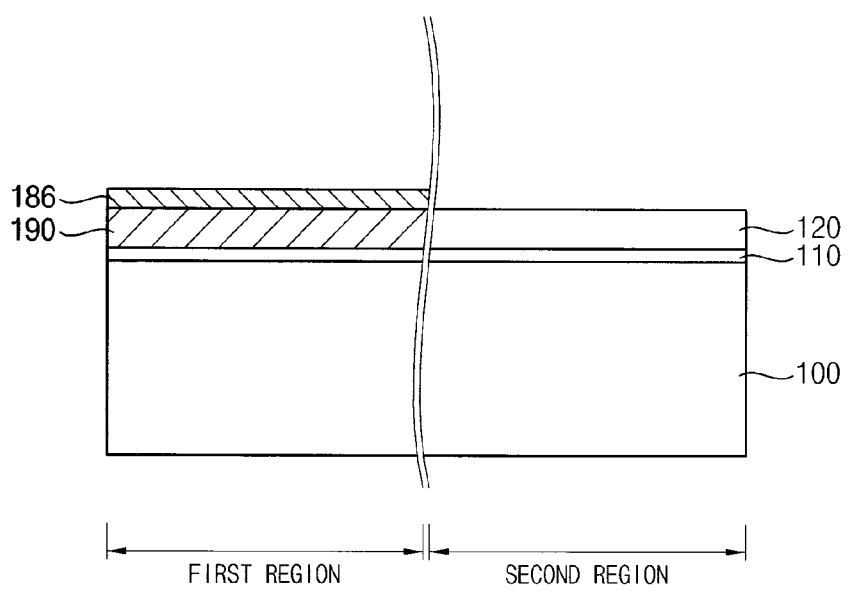

Referring to FIG. 14, the photoresist pattern 182 may be removed from the capping layer pattern 180a by the same process as described with reference to FIG. 5. In addition, an additional annealing process may be performed on the capping layer pattern 180a and the first high-k layer 120 by the same process as described with reference to FIG. 6. A portion of the compositions of the capping layer pattern 180a may permeate into the first high-k layer 120 in the first region of the substrate 100 and thus the capping layer pattern 180a may be formed into a reduced capping layer pattern 186 having a reduced thickness compared to that of the capping layer pattern 180a and the first high-k layer 120 may be transformed into a second high-k layer 190 in the first region of the substrate 100. When the capping layer pattern 180a may include lanthanum oxide, the second high-k layer may allow a gate electrode to have an effective work function sufficient for an NMOS transistor.

Figure 15:
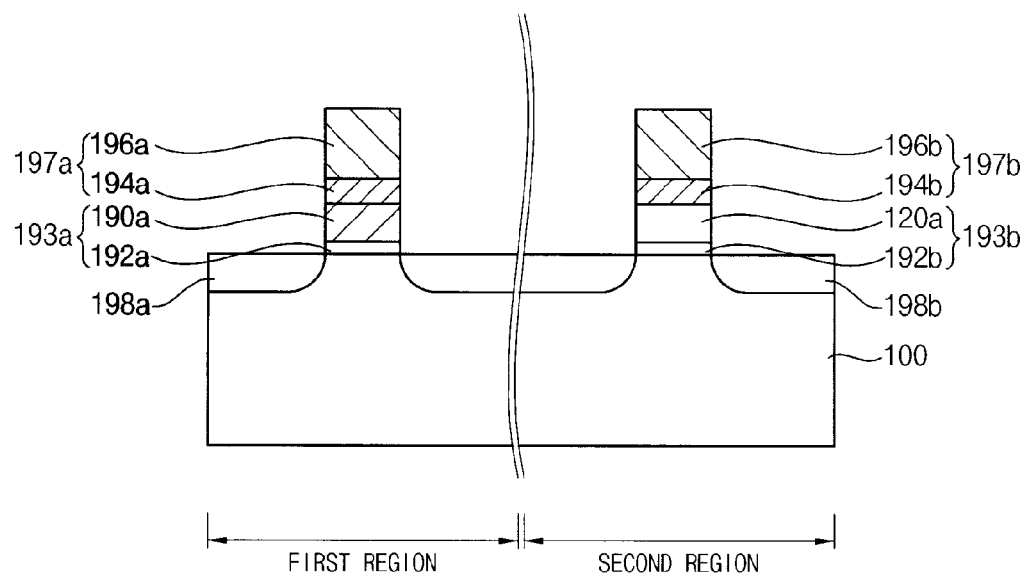

Referring to FIG. 15, the reduced capping layer pattern 186 may be removed from the second high-k layer 190 by a cleaning process using the same cleansing solution described with reference to FIG. 4, and thus the second high-k layer 190 and the first high-k layer 120 having different electric characteristics may be formed on the interface layer 110 at the first and the second regions of the substrate 100, respectively. The first and the second high-k layers 120 and 190 may function as a gate insulation layer at the second and the first regions of the substrate 100.

Thereafter, an NMOS transistor and a PMOS transistor may be formed on the first and the second regions of the substrate 100 with a sufficient threshold voltage, respectively, by the same process as described with reference to FIGS. 8 to 10. A first gate insulation pattern 193a and a first gate electrode pattern 197a may be formed on the first region of the substrate 100 and a second gate insulation pattern 193b and a second gate electrode pattern 197b may be formed on the second region of the substrate 100. Thereafter, n-type impurities may be implanted onto the first region of the substrate 100 to thereby form first source/drain regions 198a and p-type impurities may be implanted onto the second region of the substrate 100 to thereby form second source/drain regions 198b. The gate electrodes 197a and 197b of the NMOS and the PMOS transistors may include the same metal nitride, thereby simplifying the manufacturing process of a semiconductor device having a CMOS transistor.

FIGS. 16 to 20 are cross-sectional views illustrating processing steps for a method of manufacturing a semiconductor device in accordance with an example of the present inventive concept.

Figure 16:
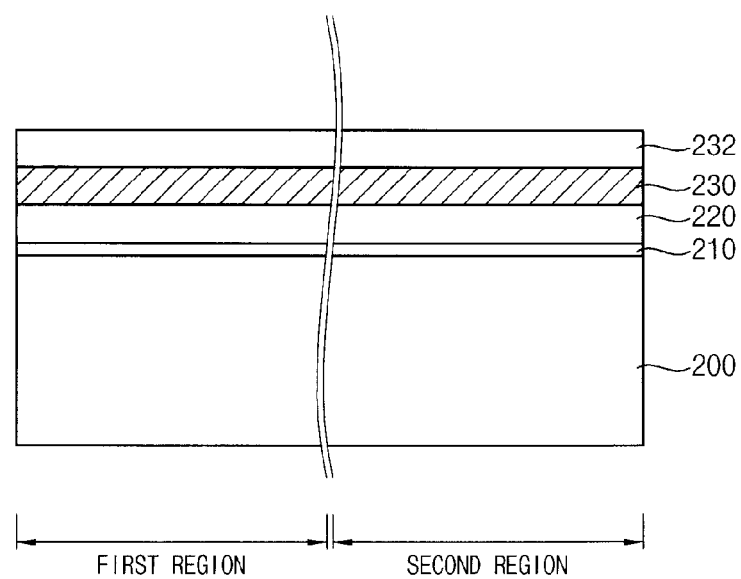
FIGS. 16 to 20 are cross-sectional views illustrating processing steps for a method of manufacturing a semiconductor device in accordance with an example of the present inventive concept.

Referring to FIG. 16, a semiconductor substrate 200 such as a silicon wafer may be prepared for manufacturing the semiconductor device. The semiconductor substrate 200 may include a first region and a second region. For example, the first region of the substrate 200 may include an NMOS region on which an N-channel MOS transistor may be formed and the second region of the substrate 200 may include a PMOS region on which a P-channel MOS transistor may be formed.

An interface layer 210 may be formed on the first and the second regions of the substrate 200 to a thickness of about 0.2 Å to about 15 Å. The interface layer 210 may prevent an unexpected boundary layer between the substrate 100 and a dielectric layer comprising a material of a high dielectric constant k (hereinafter, referred to as high-k layer) that may be formed on the interface layer 210 in a subsequent process. For example, the interface layer 210 may include a low-k material layer having a dielectric constant below about 9 such as a silicon nitride layer having a dielectric constant of about 4 and a silicon oxynitride layer having a dielectric constant in a range of about 4 to about 8 in accordance with compositions of oxygen and nitrogen. In addition, the dielectric layer may also include a silicate layer. Those examples of the interface layer 210 may be used alone or in combinations thereof.

A first high-k layer 220 may be formed on the interface layer 220. For example, the high-k layer may include hafnium oxide (HfOx), hafnium silicon oxide (HfSiO), hafnium silicon oxynitride (HfSiON), hafnium aluminum oxide (HfAlO), titanium oxide (TiOx), aluminum titanium oxide (AlTiO), aluminum nitride (AlN) and combinations thereof.

In the present example, a hafnium oxide (HfO2) layer may be formed on the interface layer 210 by the same process as described with reference to FIG. 1 to a thickness of about 0.2 Å to about 50 Å as the first high-k layer 220. Particularly, the hafnium oxide (HfO2) layer may be formed to a thickness of about 5 Å to about 50 Å.

Although not illustrated in figures, the hafnium oxide (HfO2) layer may become dense by an annealing process in an atmosphere of a gas including nitrogen (N). Examples of the gases including nitrogen atom may include nitrogen (N2) gas, nitrogen monoxide (NO) gas, nitrous oxide (N2O) gas and ammonium (NH3) gas. These may be used alone or in combinations thereof. Otherwise, the hafnium oxide (HfO2) layer may become dense by an annealing process in a vacuum atmosphere without any gases.

A capping layer 230 may be formed on the first high-k layer 220. The capping layer 230 may include a single layer of aluminum nitride (AlNx), aluminum oxide (AlOx), dysprosium oxide (DyOx) and silicon oxide (SiOx) or a multilayer thereof. The capping layer 230 may change compositions of the first high-k layer 220 and thus the first high-k layer may be changed to a gate insulation layer having a sufficient effective work function for a PMOS transistor.

In the present example, an aluminum oxide (Al2O3) layer may be formed on the first high-k layer 220 to a thickness below about 50 Å as the capping layer 230. The aluminum oxide (Al2O3) layer may be formed to a thickness of about 0.2 Å to about 50 Å, and particularly, of about 5 Å to about 50 Å. The aluminum oxide layer may be formed by the same process as described with reference to FIG. 2.

Further, an annealing process may be performed on the capping layer 230 in an atmosphere of a gas including nitrogen atom. Examples of the gases including nitrogen atom may include nitrogen (N2) gas, nitrogen monoxide (NO) gas, nitrous oxide (N2O) gas and ammonium (NH3) gas. These may be used alone or in combinations thereof. Otherwise, the annealing process may be performed in a vacuum atmosphere without any gases.

A silicon oxide layer 232 may be formed on the capping layer 230 as a hard mask for a subsequent process. The silicon oxide layer 232 may include boron phosphorus silicate glass (BPSG), an oxide layer formed by a high density plasma CVD process, a thermal oxide layer and a silicate on glass (SOG).

Figure 17:
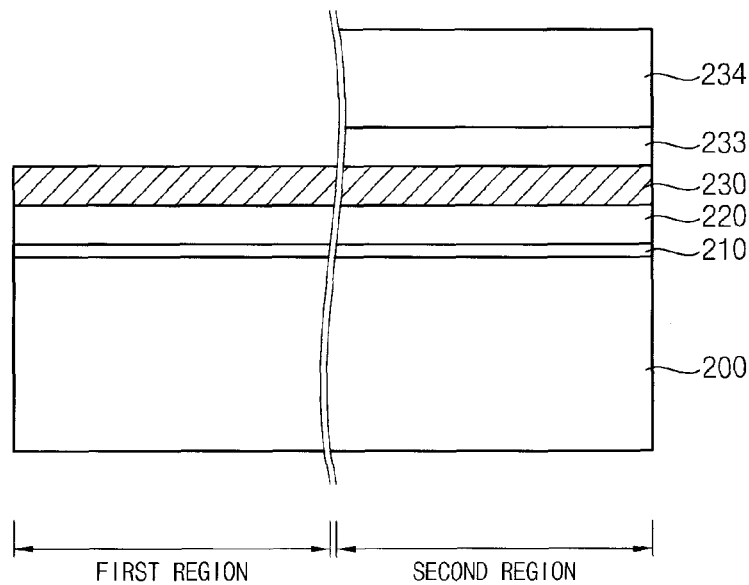

Referring to FIG. 17, a photoresist pattern 234 may be formed on the silicon oxide layer 232 in such a configuration that the capping layer 230 in the first region may be exposed and the capping layer 230 and the silicon oxide layer 232 in the second region may be covered with the photoresist pattern 234. For example, a photoresist film (not illustrated) may be formed on a whole surface of the silicon oxide layer 232 across the first and the second regions and a portion of the photoresist film corresponding to the first region may be removed from silicon oxide layer 232 by an exposure and development process. Thus, the photoresist film may remain just only on the silicon oxide layer 232 corresponding to the second region of the substrate 200 to thereby form the photoresist pattern 234 covering the silicon oxide layer 232 and the capping layer 230 in the second region of the substrate 200. When the photoresist pattern 234 may be misaligned with the first and the second regions of the substrate 200, the misaligned photoresist pattern may be removed from the substrate 200 and another photoresist pattern may be formed again to exactly expose the first region and cover the second region of the substrate 200. In such a case, the silicon oxide layer 232 may prevent the capping layer 230 from being damaged by a photolithography process for forming again the new photoresist pattern.

The silicon oxide layer 232 may be removed from the capping layer 230 at the first region by an etching process using the photoresist pattern as an etching mask, to thereby form a silicon oxide pattern 233 on the capping layer 230 at the second region of the substrate 200.

Figure 18:
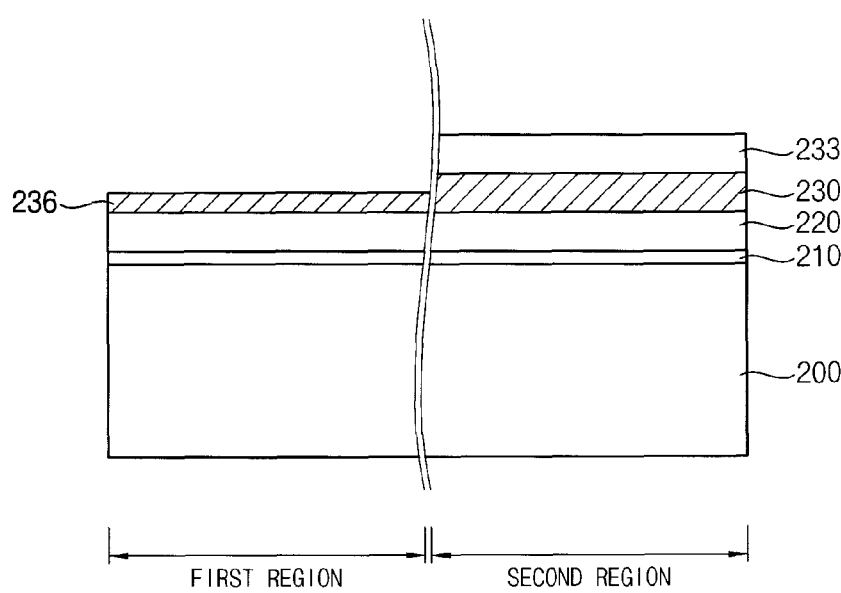

Referring to FIG. 18, the photoresist pattern 234 may be removed from silicon oxide pattern 233 by one of an ashing process, a strip process and a wet etching process.

When the photoresist pattern 234 may be removed from the silicon oxide pattern 233, an upper portion of the capping layer 230 may also be removed off together with the photoresist pattern 234, thereby forming a reduced capping layer 236 on the first high-k layer 220 in the first region of the substrate 100. While the present example discloses that the reduced capping layer 236 may be formed together with the removal of the photoresist pattern 234, the photoresist pattern 234 may be removed from the substrate 100 after the formation of a capping layer pattern through subsequent processes, as would be known to one of the ordinary skill in the art.

Figure 19:
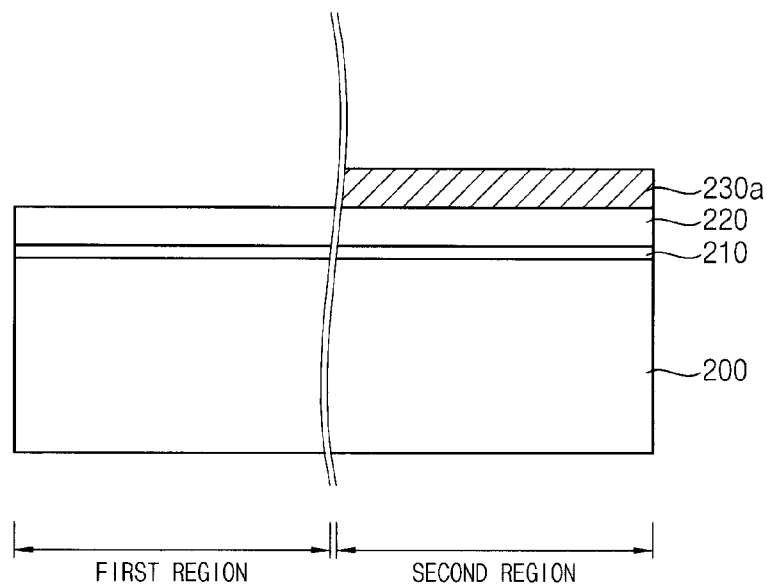

Referring to FIG. 19, the silicon oxide pattern 233 may be removed from the capping layer 230 in the second region of the substrate 100 and the reduced capping layer 236 may be removed from the first high-k layer 220 in the first region of the substrate 200. For example, the reduced capping layer 236 and the silicon oxide pattern 234 may be removed from the substrate together with each other. Therefore, the first high-k layer 220 may be uncovered at the first region of the substrate 200 and the capping layer 230 may be formed into a capping layer pattern 230a on the first high-k layer 220 at the second region of the substrate 200.

For example, the removal of the silicon oxide pattern 233 and the reduced capping layer 236 may be performed by a wet etching process. An etchant for the wet etching process may include a water mixture of an acid of about 0.01 wt % to about 3 wt %, a fluoride salt of about 10 wt % to about 40 wt % and de-ionized water. The etchant may further include a surfactant of about 0 wt % to about 1.0 wt %. The acid may be dissociated into hydrogen ions in the water mixture. Examples of the acid may include hydrochloric acid, sulfuric acid, nitric acid and phosphoric acid as well as fluoric acid. The fluoride salt may be dissociated into fluoride ions (F—) or difluoride ions (HF2-) in the water mixture. Examples of the fluoride salt may include potassium difluoride ($KHF_2$), ammonium fluoride ($NH_4F$), ammonium bifluoride ($NH_4HF_2$) and hydrogen fluoride pyridine. The surfactant may include chemical compounds having both of a hydrophilic group of a fluorine-based material and a hydrophobic group of a silicon-based material.

In another example, the etchant may include an acid less than about 1 wt %. In such a case, the acid may barely be included in the etchant for the wet etching process.

When the reduced capping layer 236 is removed from the first high-k layer 220 in the first region by the wet etching process using the etchant, the first high-k layer 220 under the reduced capping layer 236 may be rarely etched off by the etchant. That is, the reduced capping layer 236 may have etching selectivity with respect to the first high-k layer 220.

No substantial damage is caused to the capping layer pattern 230a in the wet etching process for removing the reduced capping layer 236 since the capping layer pattern 230a may be covered with the silicon oxide pattern 233 in the second region of the substrate 200. Thus, the leakage current caused by defects of the capping layer pattern 230a and the first high-k layer 220 may be sufficiently prevented in the semiconductor device.

Figure 20:
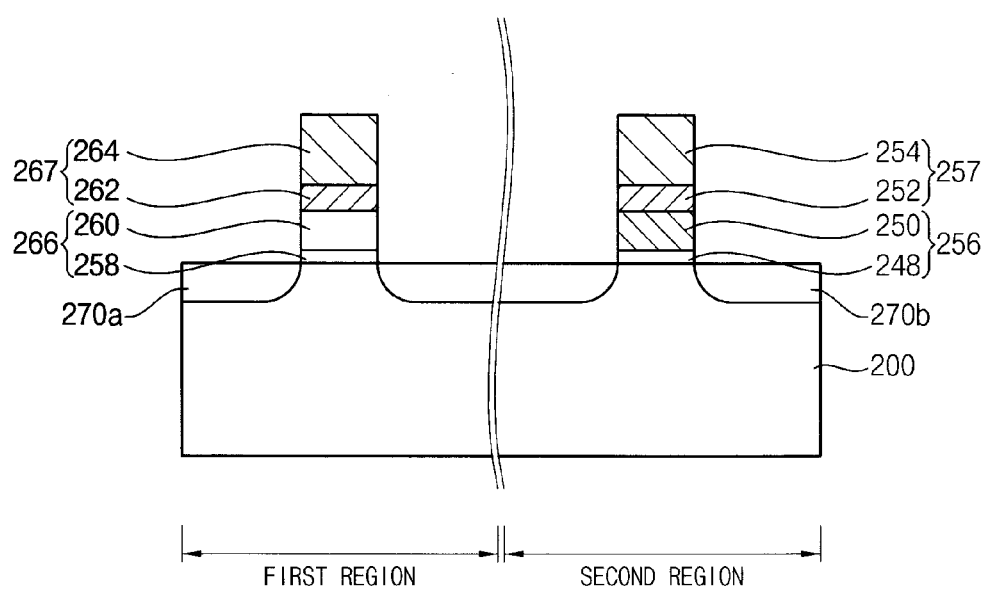

Referring to FIG. 20, a first gate insulation pattern 266 and a first gate electrode pattern 267 may be formed at the first region of the substrate 200 and a second gate insulation pattern 256 and a second gate electrode pattern 257 may be formed at the second region of the substrate 200 by the same process as described with reference to FIGS. 6 to 10.

Thereafter, first source/drain regions 270a may be formed at the first region of the substrate 200 and second source/drain regions 270b may be formed at the second region of the substrate 200.

Figure 21:
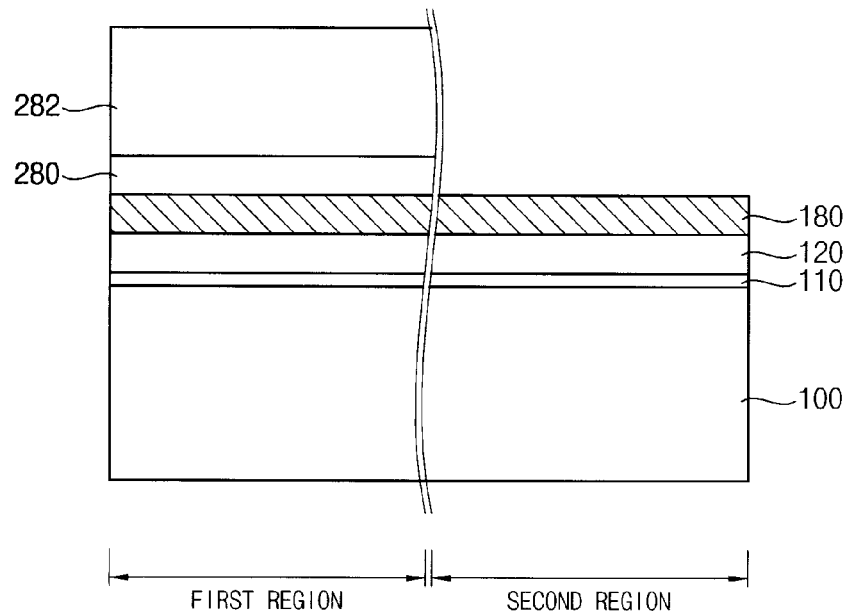
FIGS. 21 to 23 are cross-sectional views illustrating processing steps for a method of manufacturing a semiconductor device in accordance with an example of the present inventive concept.
Figure 22:
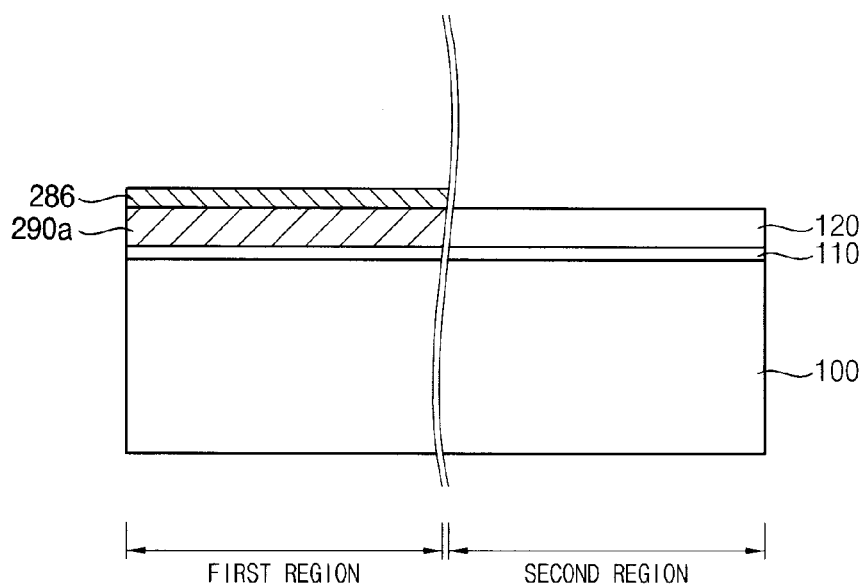
Figure 23:
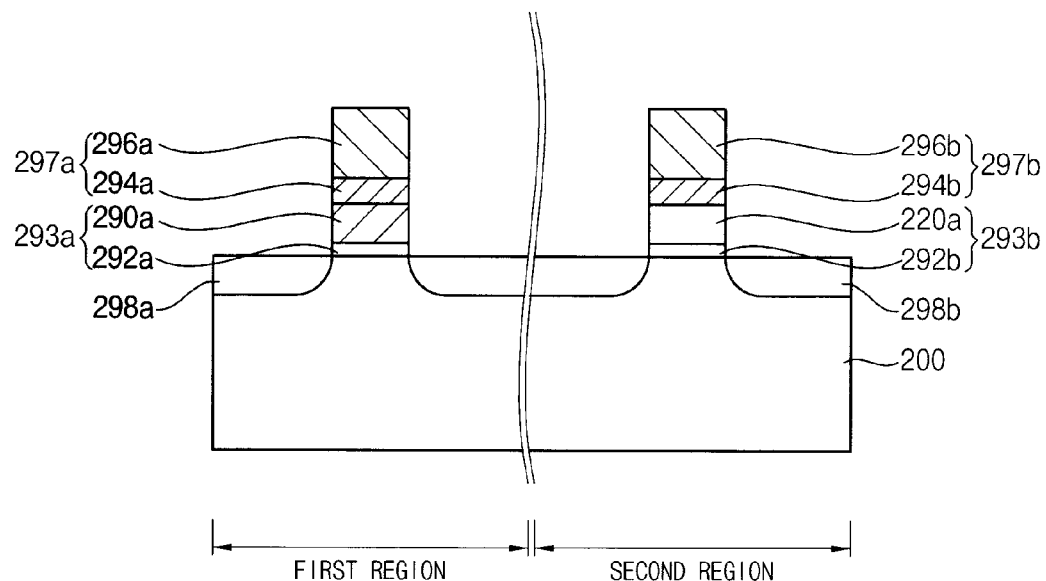

Accordingly, an NMOS transistor and a PMOS transistor may be formed on the first and the second regions of the substrate 200 with a sufficient threshold voltage and a reduced leakage current, respectively, FIGS. 21 to 23 are cross-sectional views illustrating processing steps for a method of manufacturing a semiconductor device in accordance with an example of the present inventive concept.

The present example method of manufacturing a semiconductor device may be substantially the same as the manufacturing method of a semiconductor device described with reference to FIGS. 16 to 20, except that the capping layer may be removed from the second region of the substrate.

An interface layer 110, a first high-k layer 120 and a capping layer 180 may be sequentially formed on a semiconductor substrate 100 by the same processes as described with reference to FIG. 1 and FIG. 11.

The capping layer 180 may be formed on the first high-k layer 120 and may include lanthanum oxide (LaOx) The capping layer 180 of lanthanum oxide may change compositions of the first high-k layer 120, and thus may change an effective work function of a gate electrode of an NMOS transistor.

Referring to FIG. 21, a silicon oxide layer (not illustrated) may be formed on the capping layer 180 as a hard mask for a subsequent process. The silicon oxide layer may include boron phosphorus silicate glass (BPSG), an oxide layer formed by a high density plasma CVD process, a thermal oxide layer and a silicate on glass (SOG).

A photoresist pattern 282 may be formed on the silicon oxide layer in such a configuration that the capping layer 180 in the first region may be covered with the photoresist pattern 282 and the silicon oxide layer in the second region may be exposed. The silicon oxide layer may be removed from the capping layer 180 at the second region of the substrate 100 by an etching process using the photoresist pattern 282 as an etching mask, to thereby form a silicon oxide pattern 280 on the capping layer 180 at the first region of the substrate 100. Thus, the capping layer 280 may be exposed at the second region of the substrate 100.

Referring to FIG. 22, the photoresist pattern 282 and the silicon oxide pattern 280 may be removed from the capping layer 180 at the first region of the substrate 100 and the capping layer 180 may be formed into a capping layer pattern 286 on the first high-k layer 120 at the first region of the substrate 100.

Particularly, the photoresist pattern 282 may be removed from the silicon oxide pattern 280 at the first region of the substrate 100. An upper portion of the capping layer 180 may also be removed together with the photoresist pattern, thereby forming a reduced capping layer (not illustrated) of which the thickness may be reduced as compared with the capping layer 180.

Then, the silicon oxide pattern 280 and the reduced capping layer may be simultaneously etched off at the first and the second regions of the substrate 100, respectively. Therefore, the capping layer 180 may remain on the first high-k layer just at the first region of the substrate 100, thereby forming a capping layer pattern 286 on the first high-k layer 120 at the first region of the substrate 100. The removal of the silicon oxide pattern 280 and the reduced capping layer may be performed by the same wet etching process as described with reference to FIG. 19. Therefore, the capping layer pattern 286 and the first high-k layer 120 under the capping layer pattern 286 may be protected from the wet etching process for removing the reduced capping layer since the capping layer 180 may be covered with the silicon oxide pattern 280 in the wet etching process.

Thereafter, the first high-k layer 120 at the first region of the substrate 100 may be converted into a second high-k layer 290a by the same process as described with reference to FIG. 6. Particularly, the second high-k layer 290a may allow a gate electrode thereon to have an effective work function sufficient for an NMOS transistor. The capping layer pattern 286 may have a reduced thickness as compared with the thickness of the capping layer 280.

Referring to FIG. 23, the capping layer pattern 286 may be removed from the second high-k layer 290a by a wet etching process using the etchant described with reference to FIG. 4. Thus, the second high-k layer 290a and the first high-k layer 120 having different electric characteristics may be formed on the interface layer 110 at the first and the second regions of the substrate 100, respectively. The first and the second high-k layers 120 and 290a may function as a gate insulation layer at the second and the first regions of the substrate 100.

Thereafter, an NMOS transistor and a PMOS transistor may be formed on the first and the second regions of the substrate 100 with a sufficient threshold voltage, respectively, by the same process as described with reference to FIGS. 8 to 10. A first gate insulation pattern 293a and a first gate electrode pattern 297a may be formed on the first region of the substrate 100 and a second gate insulation pattern 293b and a second gate electrode pattern 297b may be formed on the second region of the substrate 100. Thereafter, n-type impurities may be implanted onto the first region of the substrate 100 to thereby form first source/drain regions 298a and p-type impurities may be implanted onto the second region of the substrate 100 to thereby form second source/drain regions 298b. The gate electrodes 297a and 297b of the NMOS and the PMOS transistors may include the same metal nitride, thereby simplifying the manufacturing process of a semiconductor device having a CMOS transistor.

FIGS. 24 to 29 are cross-sectional views illustrating processing steps for a method of manufacturing a semiconductor device in accordance with an example of the present inventive concept.

Figure 24:
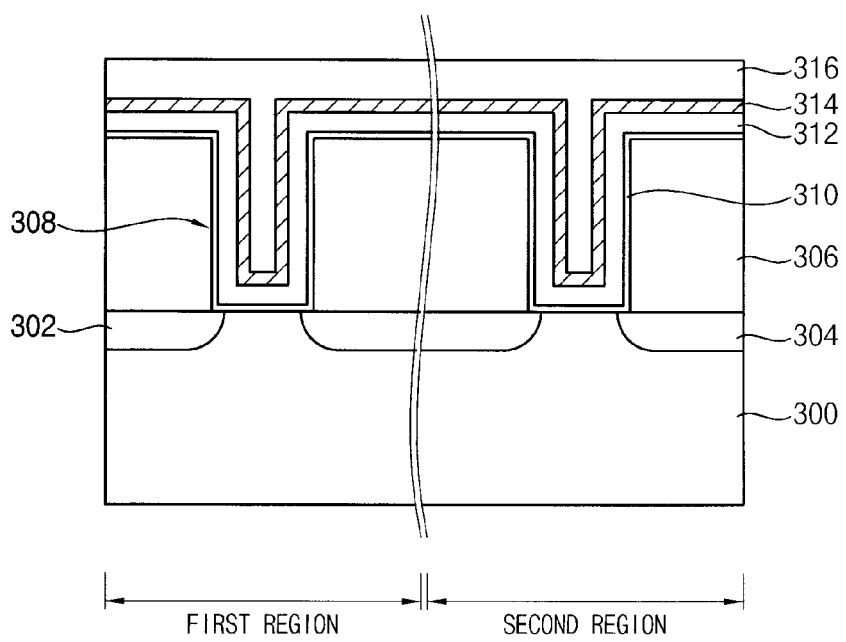
FIGS. 24 to 29 are cross-sectional views illustrating processing steps for a method of manufacturing a semiconductor device in accordance with an example of the present inventive concept.

Referring to FIG. 24, a semiconductor substrate 300 such as a silicon wafer may be prepared for manufacturing the semiconductor device. The semiconductor substrate 300 may include a first region and a second region. For example, the first region of the substrate 300 may include an NMOS region on which an N-channel MOS transistor may be formed and the second region of the substrate 300 may include a PMOS region on which a P-channel MOS transistor may be formed.

A mask pattern (not illustrated) may be formed on the substrate 300 and impurities may be doped into the first and the second regions of the substrate 300. Thus, first source/ drain regions 302 for the NMOS transistor may be formed on the first region of the substrate 300 and second source/drain regions 304 for the PMOS transistor may be formed on the second region of the substrate 300 by an ion implantation process using the mask pattern as an ion implantation mask.

An insulation interlayer 306 may be formed on the substrate 300. For example, the insulation interlayer 306 may include a silicon oxide layer formed by a deposition process.

The insulation interlayer 306 may be partially etched off to thereby form a trench 308 at the first and second regions of the substrate 300, respectively. The substrate 300 interposed between the source and the drain regions may be exposed through the trench 308 at the first and the second regions, respectively.

An interface layer 310 may be formed on the insulation interlayer 306 and on a sidewall and a bottom of the trenches 308 by the same process as described with reference to FIG. 1.

A first high-k layer 312 may be formed on the interface layer 310 along a surface profile of the trenches 308. Thus, the first high-k layer 312 may be formed along an upper surfaced of the insulation interlayer 306 and the sidewall and the bottom of the trenches 308 in such a manner that the trench may still be empty. The first high-k layer 312 may be formed by the same process as described with reference to FIG. 1.

A capping layer 314 may be formed on the first high-k layer 312 along a surface profile of the trenches 308. Thus, the capping layer 314 may be formed along an upper surfaced of the insulation interlayer 306 and the sidewall and the bottom of the trenches 308 in such a manner that the trench may still be empty. The capping layer 314 may change the compositions of the first high-k layer 312 and thus a gate electrode that may be formed on the first high-k layer 312 may have an effective work function sufficient for an NMOS transistor.

For example, the capping layer 314 may change the compositions of the first high-k layer 312 in such a manner that the gate electrode of the PMOS transistor may have a sufficient efficient work function. In such a case, the capping layer 314 may include a single layer of aluminum nitride (AlNx), aluminum oxide (AlOx), dysprosium oxide (DyOx) and silicon oxide (SiOx) or a multilayer thereof.

Although not illustrated in the figures, an annealing process may be performed on the capping layer 314 in the same manner as described with reference to FIG. 2.

Then, a photoresist film 316 may be formed on the capping layer 314 to a sufficient thickness to fill up the trench 308.

Figure 25:
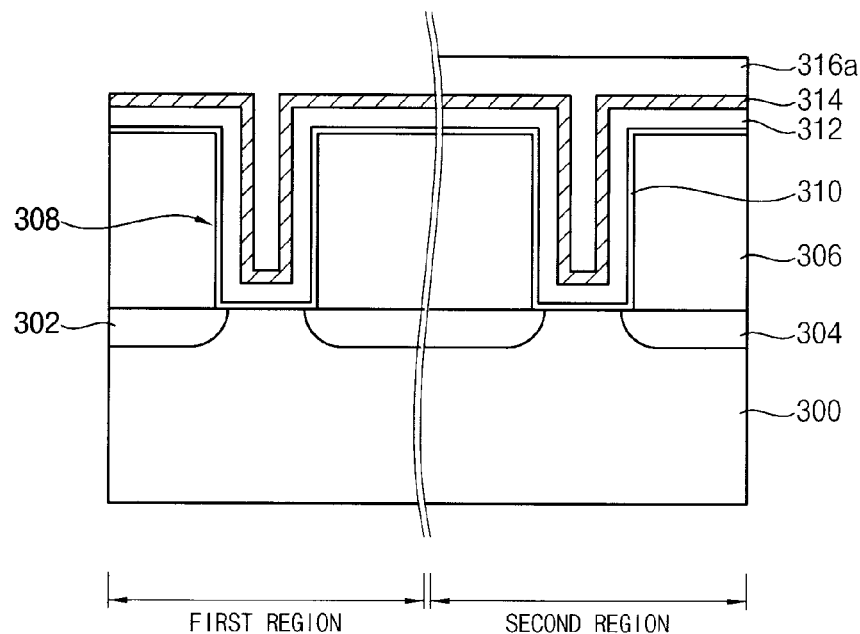

Referring to FIG. 25, the photoresist film 316 may be removed from the capping layer 314 by a photolithography process in such a configuration that the capping layer 314 in the first region of the substrate 300 may be uncovered and the capping layer 314 in the second region of the substrate 300 may be still covered with the photoresist film 316, thereby forming a photoresist pattern 316a on the capping layer 314. In addition, an upper portion of the capping layer pattern 314 may be removed together with the photoresist film 316 at the first region of the substrate 300, and thus a thickness of the capping layer 314 may be reduced at the first region of the substrate 300. Thus, the capping layer 314 at the first region may be converted into a reduced capping layer (not illustrated) after the formation of the photoresist pattern 316a.

Figure 26:
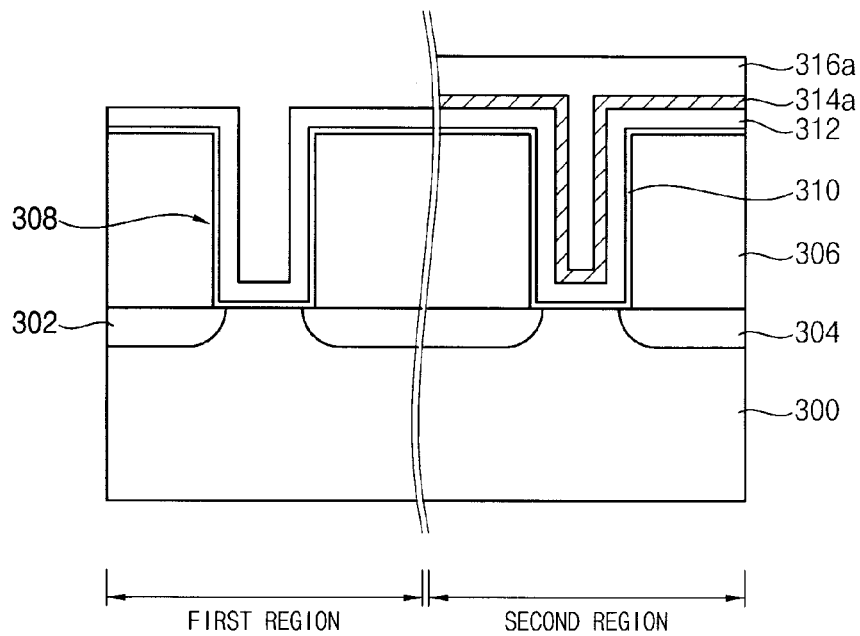

Referring to FIG. 26, the reduced capping layer may be removed from the first high-k layer 312 at the first region of the substrate 300 and thus the capping layer 314 may remain on the first high-k layer 312 at the second region of the substrate 300, thereby forming a capping layer pattern 314a on the first high-k layer 312 at the second region of the substrate 300. The reduced capping layer may be removed from the first high-k layer 312 by an etching process described with reference to FIG. 4. Accordingly, minimal or no damage may be caused to the first high-k layer 312 and the capping pattern 314a by the etching process for removing the reduced capping layer since the first high-k layer 312 and the capping pattern 314a may be covered with the photoresist pattern 316a at the second region of the substrate 300.

Figure 27:
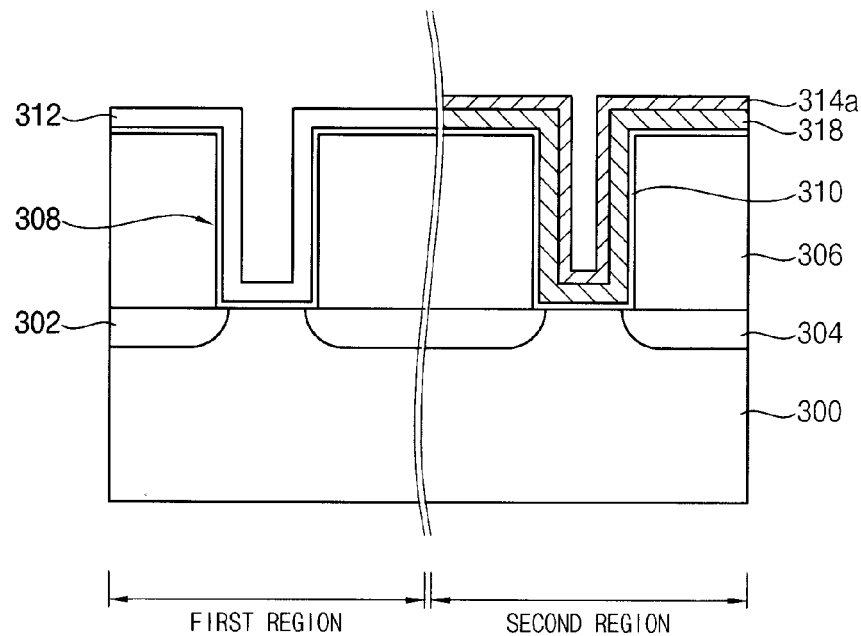

Referring to FIG. 27, the photoresist pattern 316a may be removed from the capping layer pattern 314a by one of an ashing process, a strip process and a wet etching/cleaning process.

An annealing process may be performed on the first high-k layer 312 and the capping layer pattern 314a in an atmosphere of a gas including nitrogen atom by the same process as described with reference to FIG. 6. A portion of the compositions of the capping layer pattern 314a may permeate into the first high-k layer 312 in the second region of the substrate 300 and thus the capping layer pattern 314a may be formed into a reduced capping layer pattern (not illustrated) having a reduced thickness compared to that of the capping layer pattern 314a and the first high-k layer 312 may be transformed into a second high-k layer 318 in the second region of the substrate 300.

Figure 28:
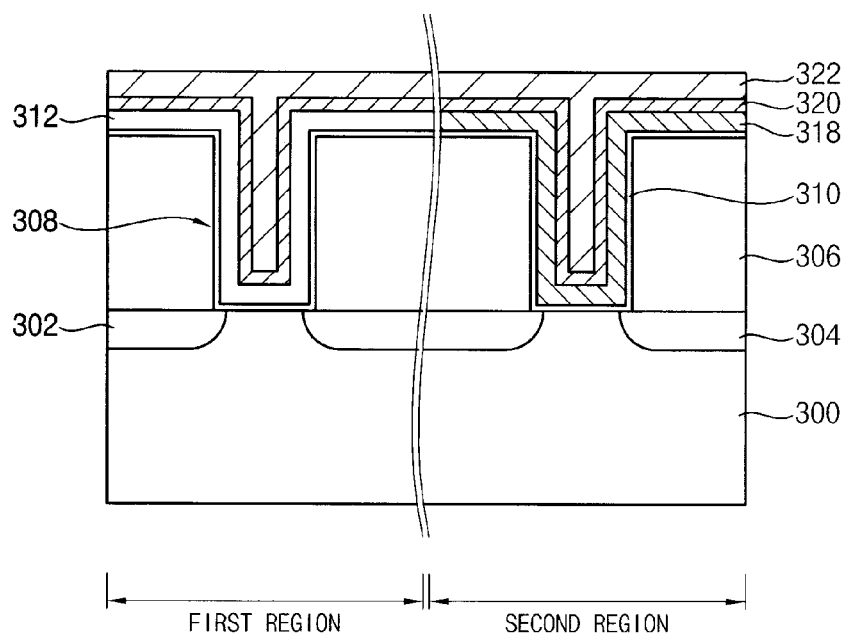

Referring to FIG. 28, the reduced capping layer pattern may be removed from the second high-k layer 318 by a wet etching process using the etchant described with reference to FIG. 4. Thus, the first high-k layer 312 and the second high-k layer 318 having different electric characteristics may be formed on the interface layer 310 at the first and the second regions of the substrate 300, respectively. The first and the second high-k layers 312 and 318 may function as a gate insulation layer at the first and the second regions of the substrate 300.

A conductive layer 320 including a metal may be formed on the first and the second high-k layers 312 and 318 across the first and the second regions of the substrate 300. The conductive layer 320 may be formed on the first and the second high-k layers 312 and 318 to a sufficient thickness to fill up the trench 308 and an upper portion of the conductive layer 320 may be planarized by a planarization process. Otherwise, the conductive layer 320 may be formed along a surface profile of the trench 308 without filling up the trench 308. In such a case, the conductive layer 320 may be formed along an upper surface of the insulation interlayer 306 and the sidewall and bottom of the trench 308. For example, the conductive layer 320 may include a metal nitride layer and the metal in the metal nitride layer may include one of tungsten (W), molybdenum (Mo), titanium (Ti), tantalum (Ta), aluminum (Al), hafnium (Hf), zirconium (Zr) and silicon (Si).

Then, a doped polysilicon layer 322 may be formed on the conductive layer 320 in such a manner that the trench 308 may be filled up with the doped polysilicon layer 322. In case that the trench 308 may be filled up with the conductive layer 320, the polysilicon layer 322 may not be formed on the conductive layer 320.

Figure 29:
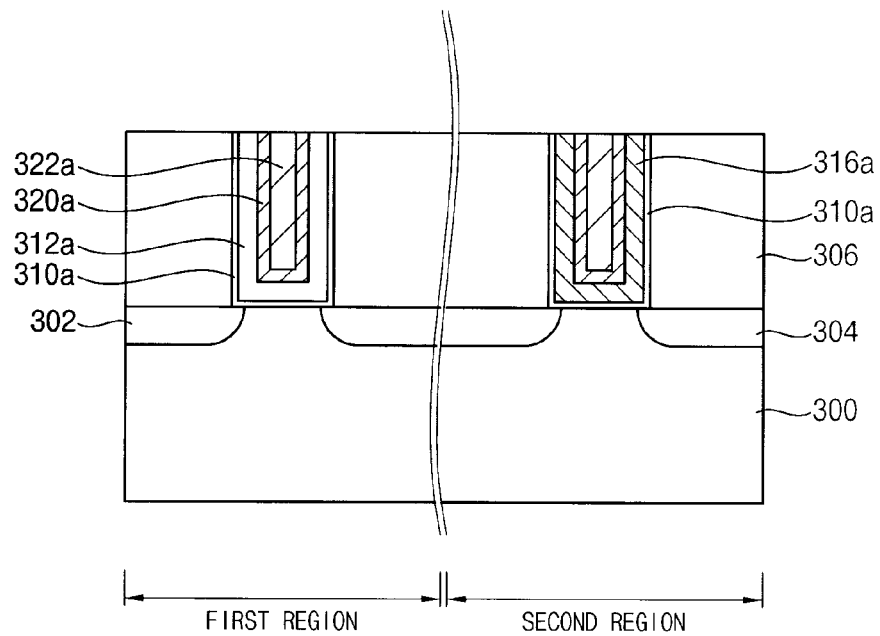

Referring to FIG. 29, the polysilicon layer 322, the conductive layer 320, the first and the second high-k layers 312 and 318 and the interface layer 310 may be partially removed from the substrate 300 by a planarization process until an upper surface of the insulation interlayer 306 may be exposed. Thus, the polysilicon layer 322, the conductive layer 320, the first and the second high-k layers 312 and 318 and the interface layer 310 may remain in the trenches 308 at the first and the second regions of the substrate 300. Accordingly, an interface pattern 310a, a first high-k layer pattern 312a, a conductive pattern 320a and a polysilicon pattern 322a may be stacked in the trench 308 at the first region of the substrate 300 to thereby form a first gate electrode in the trench 308 at the first region of the substrate. In addition, the interface pattern 310a, a second high-k layer pattern 318a, the conductive pattern 320a and the polysilicon pattern 322a may be stacked in the trench 308 at the second region of the substrate 300 to thereby form a second gate electrode in the trench 308 at the second region of the substrate 300.

Figure 30:
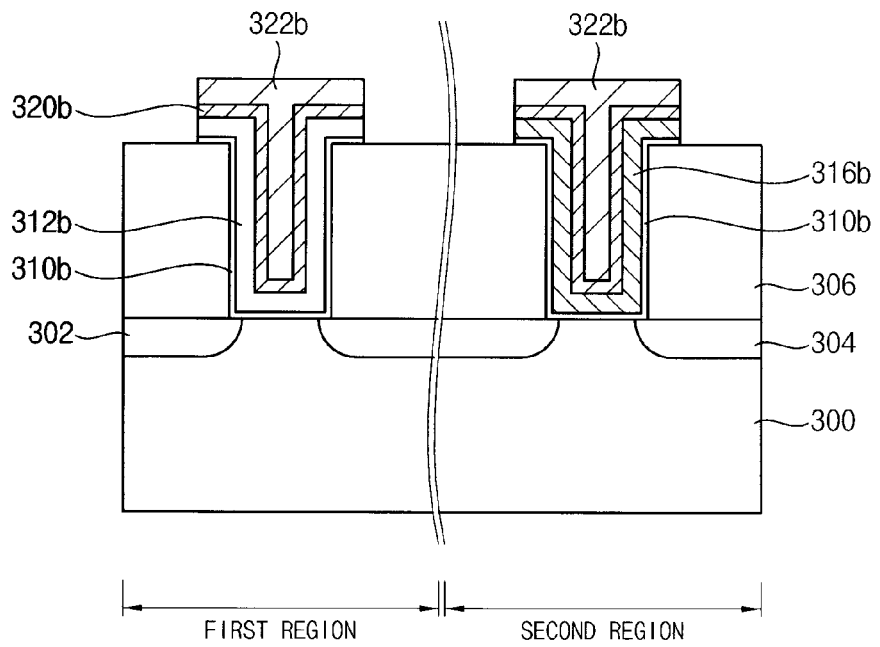
FIG. 30 is a cross-sectional view illustrating a processing step for a method of manufacturing a semiconductor device in accordance with an example of the present inventive concept.

Therefore, an NMOS transistor and a PMOS transistor may be formed on the first and the second regions of the substrate 300 with a sufficient threshold voltage, respectively, FIG. 30 is a cross-sectional view illustrating a processing step for a method of manufacturing a semiconductor device in accordance with an example of the present inventive concept.

The semiconductor device in FIG. 30 has substantially the same structure as the device illustrated in FIG. 29 except for a configuration of the gate electrode, and thus the descriptions on the semiconductor device of the present example will be focused to the gate electrode of the semiconductor device.

The conductive layer 320 and the polysilicon layer 322 may be formed on the first and the second high-k layers 312 and 318 in such a manner that the trench 308 may be filled up with the conductive layer 320 and/or the polysilicon layer 322 by the same processes as described with reference to FIGS. 24 to 28.

In the present example, the conductive layer 320 may be formed on the first and the second high-k layers 312 and 318 along the surface profile of the trench 308 and the trenches 308 may be filled up with the polysilicon layer 322 in such a manner that an upper surface of the polysilicon layer 322 may be higher than an upper surface of the insulation interlayer 306.

Referring to FIG. 30, the polysilicon layer 322, the conductive layer 320, the first and the second high-k layers 312 and 318 and the interface layer 310 may be partially removed from the substrate 300 by an etching process in such a manner that the polysilicon layer 322, the conductive layer 320, the first and the second high-k layers 312 and 318 and the interface layer 310 may remain in the trench 308 and on the upper surface of the insulation interlayer 306 around the trench 308. Accordingly, an interface pattern 310a, a first high-k layer pattern 312a, a conductive pattern 320a and a polysilicon pattern 322a may be stacked in the trench 308 and on the insulation interlayer 306 around the trench 308 at the first region of the substrate 300 to thereby form a first T-shaped gate electrode in the trench 308 at the first region of the substrate. In addition, the interface pattern 310a, a second high-k layer pattern 318a, the conductive pattern 320a and the polysilicon pattern 322a may be stacked in the trench 308 and on the insulation interlayer 306 around the trench 308 at the second region of the substrate 300 to thereby form a second T-shaped gate electrode in the trench 308 at the second region of the substrate 300.

Figure 31:
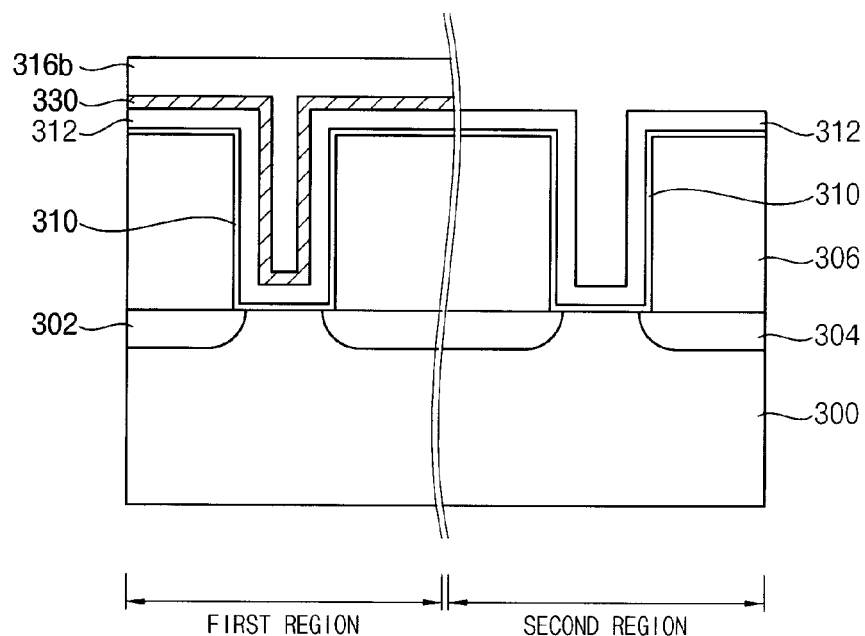
FIGS. 31 and 32 are cross-sectional views illustrating a processing step for a method of manufacturing a semiconductor device in accordance with an example of the present inventive concept.
Figure 32:
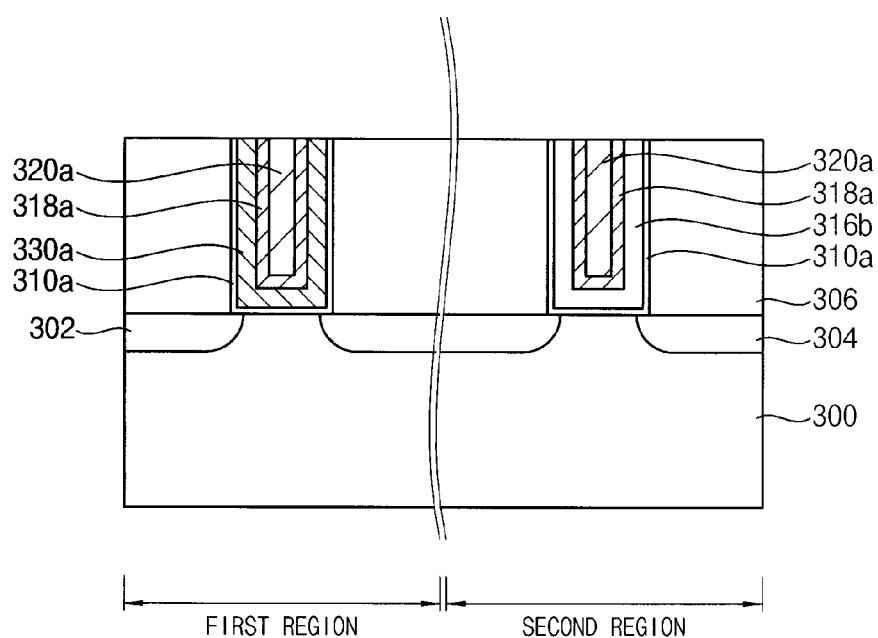

FIGS. 31 and 32 are cross-sectional views illustrating a processing step for a method of manufacturing a semiconductor device in accordance with an example of the present inventive concept.

The present example method of manufacturing a semiconductor device may be substantially the same as the manufacturing method of a semiconductor device described with reference to FIGS. 24 to 29, except that the capping layer may be removed from the second region of the substrate.

Referring to FIG. 31, a semiconductor substrate 300 such as a silicon wafer may be prepared for manufacturing the semiconductor device. The semiconductor substrate 300 may include a first region and a second region. For example, the first region of the substrate 300 may include an NMOS region on which an N-channel MOS transistor may be formed and the second region of the substrate 300 may include a PMOS region on which a P-channel MOS transistor may be formed. First source/drain regions 302 for the NMOS transistor may be formed on the first region of the substrate 300 and second source/drain regions 304 for the PMOS transistor may be formed on the second region of the substrate 300. An insulation interlayer 306 having a plurality of trenches may be formed on the substrate having the source and drain regions 302 and 304. Then, an interface layer 3010 and the first high-k layer 312 may be formed on the insulation interlayer 306 along a surface profile of the trenches through the same processes as described in detail with reference to FIG. 24.

A capping layer (not illustrated) may be formed on the first high-k layer 312 along a surface profile of the trenches. Thus, the capping layer may be formed along an upper surface of the insulation interlayer 306 and the sidewall and the bottom of the trenches 308 in such a manner that the trench may still be empty. The capping layer may change the compositions of the first high-k layer 312 and thus a gate electrode that may be formed on the first high-k layer 312 may have an effective work function sufficient for an NMOS transistor. For example, the capping layer may include lanthanum oxide (LaOx) layer.

A photoresist pattern 316b may be formed on the capping layer in such a configuration that the capping layer in the first region of the substrate 300 may be covered with the photoresist pattern 316b and the capping layer in the second region of the substrate 300 may be uncovered. Then, the capping layer may be removed from the first high-k layer 312 at the second region of the substrate 300 and thus a capping layer pattern 330 may be formed on the first high-k layer at the first region of the substrate 300. An upper portion of the capping layer pattern may be removed at the second region of the substrate 300 together with a photoresist film for forming the photoresist pattern 316b, and thus a thickness of the capping layer may be reduced at the second region of the substrate 300. Thus, the capping layer at the second region may be converted into a reduced capping layer (not illustrated) after the formation of the photoresist pattern 316b.

Referring to FIG. 32, the reduced capping layer may be removed from the first high-k layer 312 at the second region of the substrate 300 and thus the capping layer may remain on the first high-k layer 312 at the first region of the substrate 300, thereby forming a capping layer pattern 330 on the first high-k layer 312 at the first region of the substrate 300. The reduced capping layer may be removed from the first high-k layer 312 by an etching process described with reference to FIG. 4 at the second region of the substrate 300. Accordingly, minimal or no damage may be caused to the first high-k layer 312 and the capping pattern 330 by the etching process for removing the reduced capping layer since the first high-k layer 312 and the capping pattern 330 may be covered with the photoresist pattern 316b at the first region of the substrate 300.

Then, the photoresist pattern 316b may be removed from the capping layer pattern 330 by one of an ashing process, a strip process and a wet etching/cleaning process.

An annealing process may be performed on the first high-k layer 312 and the capping layer pattern 330 in an atmosphere of a gas including nitrogen atom by the same process as described with reference to FIG. 6. A portion of the compositions of the capping layer pattern 330 may permeate into the first high-k layer 312 at the first region of the substrate 300 and thus the capping layer pattern 330 may be formed into a reduced capping layer pattern (not illustrated) having a reduced thickness compared to that of the capping layer pattern 330 and the first high-k layer 312 may be transformed into a second high-k layer (not illustrated) in the first region of the substrate 300.

The reduced capping layer pattern may be removed from the second high-k layer at the first region of the substrate 300 by a wet etching process using the etchant described with reference to FIG. 4. Thus, the second high-k layer and the first high-k layer 312 having different electric characteristics may be formed on the interface layer 310 at the first and the second regions of the substrate 300, respectively. The first and the second high-k layers 312 may function as a gate insulation layer at the second and the first regions of the substrate 300.

A conductive layer (not illustrated) including a metal may be formed on the first and the second high-k layers across the first and the second regions of the substrate 300. The conductive layer 320 may be formed on the first and the second high-k layers to a sufficient thickness to fill up the trench 308 and an upper portion of the conductive layer 320 may be planarized by a planarization process. Otherwise, the conductive layer 320 may be formed along a surface profile of the trench 308 without filling up the trench 308. In such a case, the conductive layer 320 may be formed along an upper surface of the insulation interlayer 306 and the sidewall and bottom of the trench 308. Then, a doped polysilicon layer may be formed on the conductive layer in such a manner that the trench 308 may be filled up with the doped polysilicon layer.

The polysilicon layer, the conductive layer, the first and the second high-k layers and the interface layer 310 may be partially removed from the substrate 300 by a planarization process until an upper surface of the insulation interlayer 306 may be exposed. Thus, the polysilicon layer, the conductive layer, the first and the second high-k layers and the interface layer 310 may remain in the trenches 308 at the first and the second regions of the substrate 300. Accordingly, an interface pattern 310a, a second high-k layer pattern 330a, a conductive pattern 318a and a polysilicon pattern 320a may be stacked in the trench 308 at the first region of the substrate 300 to thereby form a first gate electrode in the trench 308 at the first region of the substrate 300. In addition, the interface pattern 310a, a first high-k layer pattern 316b, the conductive pattern 318a and the polysilicon pattern 320a may be stacked in the trench 308 at the second region of the substrate 300 to thereby form a second gate electrode in the trench 308 at the second region of the substrate 300.

Figure 33:
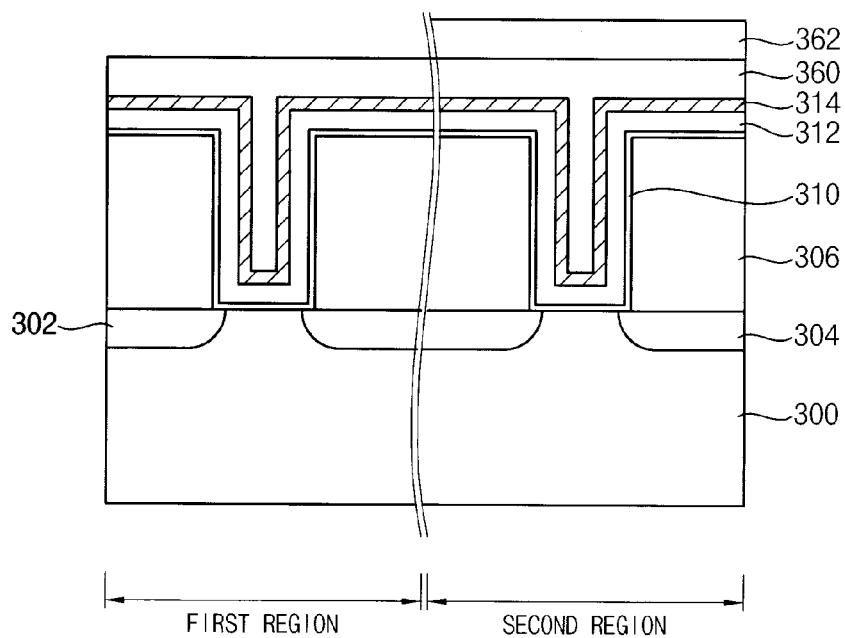
FIGS. 33 to 35 are cross-sectional views illustrating a processing step for a method of manufacturing a semiconductor device in accordance with an example of the present inventive concept.
Figure 35:
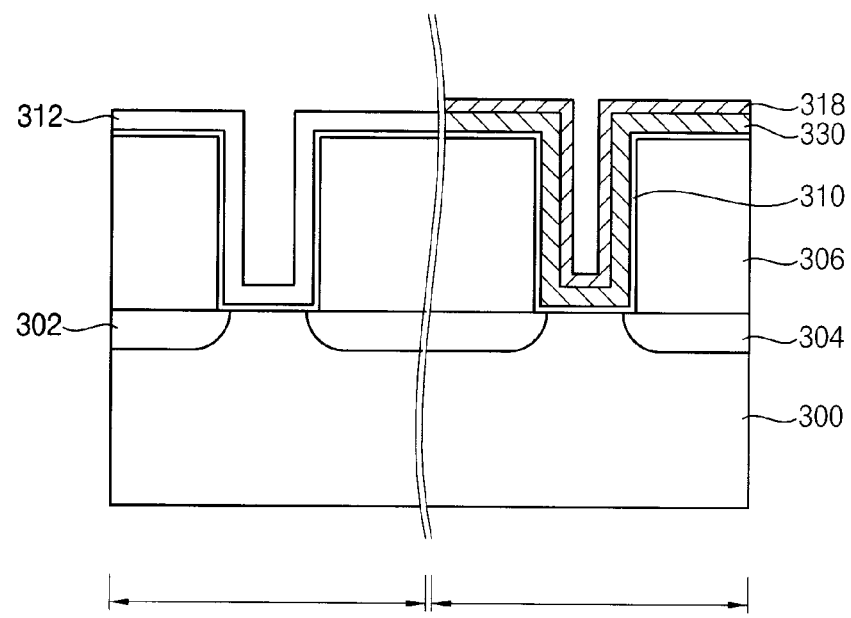

Therefore, an NMOS transistor and a PMOS transistor may be formed on the first and the second regions of the substrate 300 with a sufficient threshold voltage, respectively, FIGS. 33 and 35 are cross-sectional views illustrating a processing step for a method of manufacturing a semiconductor device in accordance with an example of the present inventive concept.

Referring to FIG. 33 a semiconductor substrate 300 such as a silicon wafer may be prepared for manufacturing the semiconductor device. The semiconductor substrate 300 may include a first region and a second region. For example, the first region of the substrate 300 may include an NMOS region on which an N-channel MOS transistor may be formed and the second region of the substrate 300 may include a PMOS region on which a P-channel MOS transistor may be formed. First source/drain regions 302 for the NMOS transistor may be formed on the first region of the substrate 300 and second source/drain regions 304 for the PMOS transistor may be formed on the second region of the substrate 300. Then, an interface layer 3010 and the first high-k layer 312 may be formed on the insulation interlayer 306 along a surface profile of the trenches through the same processes as described in detail with reference to FIG. 24.

A capping layer 314 may be formed on the first high-k layer 312 along a surface profile of the trenches. Thus, the capping layer may be formed along an upper surface of the insulation interlayer 306 and the sidewall and the bottom of the trenches 308 in such a manner that the trench may still be empty. The capping layer 314 may change the compositions of the first high-k layer 312 and thus a gate electrode that may be formed on the first high-k layer 312 may have an effective work function sufficient for a transistor.

In an example, the capping layer 314 may change the compositions of the first high-k layer 312 in such a manner that the gate electrode of the PMOS transistor may have a sufficient efficient work function. In such a case, the capping layer 314 may include a single layer of aluminum nitride (AlNx), aluminum oxide (AlOx), dysprosium oxide (DyOx) and silicon oxide (SiOx) or a multilayer thereof. In another example, the capping layer 314 may change the compositions of the first high-k layer 312 in such a manner that the gate electrode of the NMOS transistor may have a sufficient efficient work function. In such a case, the capping layer 314 may include lanthanum oxide (LaOx).

In the present example, the capping layer 314 may change the compositions of the first high-k layer 312 in such a manner that the gate electrode of the PMOS transistor may have a sufficient efficient work function.

Then, a silicon oxide layer 360 may be formed on the capping layer 314 as a hard mask pattern. The trench may be filled up with the silicon oxide layer 360.

A photoresist pattern 362 may be formed on the silicon oxide layer 360 in such a configuration that the silicon oxide layer 360 in the first region of the substrate 300 may be uncovered and the silicon oxide layer 360 in the second region of the substrate 300 may be covered with the photoresist pattern 362.

In contrast, when the capping layer 314 may change the compositions of the first high-k layer 312 in such a manner that the gate electrode of the NMOS transistor may have a sufficient efficient work function, a photoresist pattern may be formed on the silicon oxide layer 360 in such a configuration that the silicon oxide layer 360 in the first region of the substrate 300 may be covered with the photoresist pattern 362 and the silicon oxide layer 360 in the second region of the substrate 300 may be uncovered.

Figure 34:
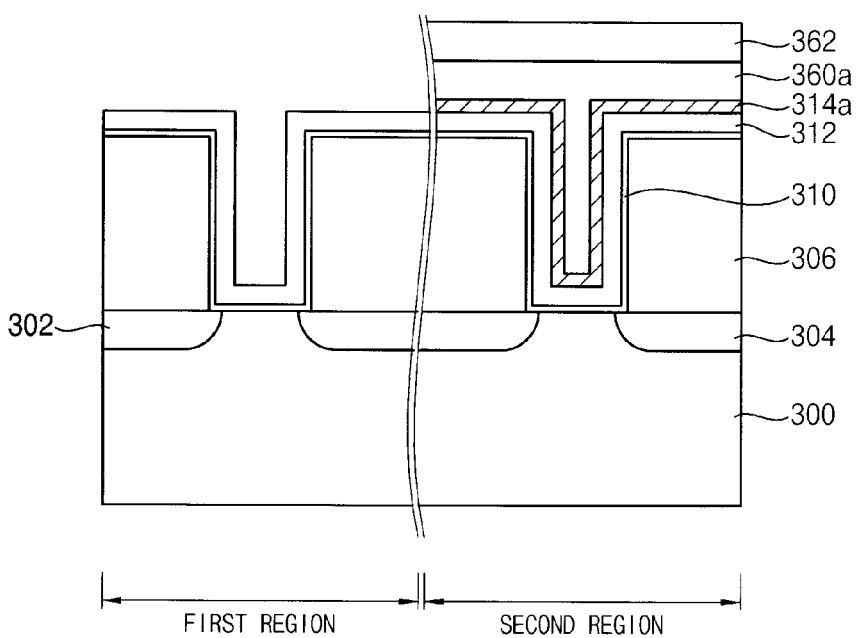

Referring to FIG. 34, the silicon oxide layer 360 may be removed from the capping layer 314 at the first region of the substrate 300 by an etching process using the photoresist pattern 360 as an etching mask, to thereby form a silicon oxide pattern 360a on the capping layer 314 at the second region of the substrate 300. Thus, the capping layer 314 may be exposed at the first region of the substrate 300. Subsequently, the capping layer 314 may be removed from the first high-k layer 312 at the first region of the substrate 300, to thereby form a capping layer pattern 314a on the first high-k layer 312 at the second region of the substrate 300.

The silicon oxide layer 360 and the capping layer 314 may be removed together with each other by the same single wet etching process described in detail with reference to FIG. 19. In contrast, the silicon layer 360 and the capping layer 314 may be individually removed by a respective wet etching process. Therefore, the first high-k layer 312 may be uncovered at the first region of the substrate 300 after the removal of the silicon oxide layer 360 and the capping layer 314.

The photoresist pattern 362 and the silicon oxide pattern 360a may be removed from the capping layer 314 at the first region of the substrate 300 and the capping layer 314 may be formed into a capping layer pattern 314a at the second region of the substrate 300.

Referring to FIG. 35, the photoresist pattern 362 and the silicon oxide pattern 360a may be removed from the second region of the substrate 300 and thus the capping layer pattern 314a may be uncovered. Since the capping layer 314 may be covered with the silicon oxide pattern 360a at the second region, the etching process for removing the capping layer 314 from the first region may cause minimal or no damage to the capping pattern 314a at the second region. Thus, the leakage current caused by defects of the capping layer pattern 314a may be sufficiently prevented in the semiconductor device.

An anneal process may be performed on the first high-k layer 312 and the capping layer pattern 314a in the same manner as described in detail with reference to FIG. 6. Thus, a portion of the compositions of the capping layer pattern 314a may permeate into the first high-k layer 312 at the second region of the substrate 300 and thus the capping layer pattern 314a may be formed into a reduced capping layer pattern 318 having a reduced thickness compared to that of the capping layer pattern 314 and the first high-k layer 312 may be converted to a second high-k layer 330 in the second region of the substrate 300.

In contrast, when the capping layer 314 changes the compositions of the first high-k layer 312 in such a manner that the gate electrode of the NMOS transistor may have a sufficient efficient work function, the first high-k layer 312 may be converted to the second high-k layer at the first region of the substrate 300.

Thereafter, the reduced capping layer pattern 318 may be removed from the second high-k layer 330 by a wet etching process using the etchant described with reference to FIG. 4. Thus, the second high-k layer 330 and the first high-k layer 312 having different electric characteristics may be formed on the interface layer 310 at the first and the second regions of the substrate 300, respectively. The first and the second high-k layers 312 and 330 may function as a gate insulation layer at the second and the first regions of the substrate 300.

Thereafter, an NMOS transistor and a PMOS transistor may be formed on the first and the second regions of the substrate 300 with a sufficient threshold voltage, respectively, by the same process as described with reference to FIGS. 28 and 29.

A polysilicon layer and a conductive layer may be formed on the first and the second high-k layers 312 and 330 in such a manner that the trenches may be filled up with the polysilicon layer and the conductive layer. Then, the polysilicon layer, the conductive layer, the first and the second high-k layers 312 and 330 and the interface layer 310 may be partially removed from the substrate 300 by a planarization process until an upper surface of the insulation interlayer 306 may be exposed. Thus, the polysilicon layer, the conductive layer, the first and the second high-k layers 312 and 330 and the interface layer 310 may remain in the trenches at the first and the second regions of the substrate 300. Accordingly, an interface pattern, a first high-k layer pattern, a conductive pattern and a polysilicon pattern may be stacked in the trench at the first region of the substrate 300 to thereby form a first gate electrode in the trench at the first region of the substrate. In addition, the interface pattern, a second high-k layer pattern, the conductive pattern and the polysilicon pattern may be stacked in the trench at the second region of the substrate 300 to thereby form a second gate electrode in the trench at the second region of the substrate 300.

Otherwise, an NMOS transistor and a PMOS transistor may be formed on the first and the second regions of the substrate 300 with a sufficient threshold voltage, respectively, by the same process as described with reference to FIGS. 28 and 30.

A polysilicon layer and a conductive layer may be formed on the first and the second high-k layers 312 and 330 to fill up the trenches. Then, the polysilicon layer, the conductive layer, the first and the second high-k layers 312 and 330 and the interface layer 310 may be partially removed from the substrate 300 by an etching process in such a manner that the polysilicon layer, the conductive layer, the first and the second high-k layers 312 and 330 and the interface layer 310 may remain in the trench and on the upper surface of the insulation interlayer 306 around the trench. Accordingly, an interface pattern, a first high-k layer pattern, a conductive pattern and a polysilicon pattern may be stacked in the trench and on the insulation interlayer 306 around the trench at the first region of the substrate 300 to thereby form a first T-shaped gate electrode in the trench at the first region of the substrate. In addition, the interface pattern, a second high-k layer pattern, the conductive pattern and the polysilicon pattern may be stacked in the trench and on the insulation interlayer 306 around the trench at the second region of the substrate 300 to thereby form a second T-shaped gate electrode in the trench at the second region of the substrate 300.

Comparative Experiment I

An etching rate of an etchant according to an example of the present inventive concept was experimentally measured and compared with that of a comparative etchant with respect to the same sample layers. The sample layers for the experiment were provided as shown in the following sample lists.

Sample Layers for the Experiment

| | |
|---|---|
| Sample layer 1 | SiO2 layer formed by an ALD process at a temperature of about 300° C. |
| Sample layer 2 | SiO2 layer formed by an ALD process at a temperature of about 500° C. |
| Sample layer 3 | Al2O3 layer formed by an CVD process at a temperature of about 380° C. |
| Sample layer 4 | Hafnium Silicate layer having hafnium (Hf) of about 40% |
| Sample layer 5 | Hafnium oxide layer having a stacked structure of a silicon oxide layer of about 11 Å and a hafnium layer of about 30 Å and experiencing an annealing process at a temperature of about 800° C. |

Etchant 1 and Etchant 2 were provided as a mixture of the following compositions in accordance with an example of the present inventive concept and the comparative etchant was provided as an aqueous hydrogen fluoride (HF) solution in which the HF was diluted with water about 200:1.

Etchant 1 was an aqueous solution which contains about 0.06 wt % of hydrogen fluoride and about 17.5 wt % of fluoride salt. Etchant 2 was an aqueous solution which contains about 0.18 wt % of hydrogen fluoride and about 17.5 wt % of fluoride salt.

The above sample layers were etched off by each etching process using the etchant 1, etchant 2 and the comparative etchant and the etching rates of etchant 1 and etchant 2 were measured and compared with those of the comparative etchant.

The sample layers were immersed into each of etchant 1, etchant 2 and the comparative etchant for about 15 seconds and the etching rates of each sample layer was measured.

Table 1 shows the measured etching rates of each etchant against Sample layer 1 to Sample layer 5. As can be seen from Table 1, the etching rate of a capping layer (e.g. Sample layers 1 through 3) with the sample etchants, as compared to the etching rate of the high-k dielectric layer (e.g. Sample layers 4 and 5) is such that the capping layer can be etched at an etch rate at least 2 times greater than the etch rate of the high-k dielectric (or at least 3 times greater, or even at least 5 times greater, or at least 7 times greater, or at least 10 times greater). In some embodiments, the capping layer can be etched at a rate at least 40 or 60 time greater than the high-k dielectric.

TABLE 1

| Unit (Å/15 s) | Sample layer 1 | Sample layer 2 | Sample layer 3 | Sample layer 4 | Sample layer 5 |
| --- | --- | --- | --- | --- | --- |
| Comparative etchant | 3.7 | 5.0 | 7.5 | 7.0 | 3.8 |
| Etchant 1 | 18.0 | 14.0 | 3.6 | 1.8 | 0.3 |
| Etchant 2 | 23.0 | — | 9.0 | 3.0 | 1.3 |

Table 2 shows relative ratios of the etching rates when the silicon oxide (SiO2) layer, the aluminum oxide (Al2O3) layer and the hafnium silicate, which experienced an ALD process at a temperature of about 300° C., were etched off in each of the etchants.

TABLE 2

|  | SiO2/Al2O3 at 300° C. | SiO2/HfSiO at 300° C. | Al2O3/HfO2 |
| --- | --- | --- | --- |
| Comparative etchant | 0.5 | 0.5 | 2.0 |
| Etchant 1 | 5.0 | 10.0 | 12.0 |
| Etchant 2 | 2.6 | 7.7 | 7.0 |

The experimental results show that the etching rate of Etchant 1 was lower than that of the comparative etchant against the aluminum oxide layer. However, the hafnium oxide layer had etching selectivity with respect to the aluminum oxide layer in the etching process using Etchant 1.

Accordingly, when the silicon oxide layer and/or the aluminum oxide layer are/is removed from the hafnium oxide layer or the hafnium silicon oxide layer by an etching process using Etchant 1 and/or Etchant 2, Table 1 and Table 2 indicates that the etchant for etching the oxide layer and/or the aluminum oxide layer may not cause damage to the hafnium oxide layer or the hafnium silicon oxide layer.

Comparative Experiment II

A leakage current was measured in sample devices and comparative devices in which the capping layers were removed by etching processes using the comparative etchant and Etchant 3, respectively.

Three sample semiconductor devices were manufactured as follows and the leakage current was measured from each of the sample devices.

A high-k layer was formed on a bare semiconductor device and an aluminum oxide layer was formed on the high-k layer as the capping layer. An annealing process was performed on the capping layer and then the capping layer was removed from the high-k layer by an etching process using Etchant 3. Etchant 3 was a solution which contains about 0.1 wt % of hydrogen chloride (HCl) and about 17.5 wt % of fluoride ammonium (NH4F). Thereafter, a gate electrode was formed on the high-k layer. The capping layers of Sample devices 1 to 3 were removed on the following respective etching conditions.

| Sample device 1 | Immersed into Etchant 3 for about 10 seconds and conducting a plasma annealing process. |
| --- | --- |
| Sample device 2 | Immersed into Etchant 3 for about 20 seconds and conducting a plasma annealing process. |
| Sample device 3 | Immersed into Etchant 3 for about 20 seconds without a plasma annealing process. |

Three comparative sample semiconductor devices were manufactured as follows and the leakage current was measured from each of the comparative sample devices.

A high-k layer was formed on a bare semiconductor device and an aluminum oxide layer was formed on the high-k layer as the capping layer. An annealing process was performed on the capping layer and then the capping layer was removed from the high-k layer by an etching process using the comparative etchant. Thereafter, a gate electrode was formed on the high-k layer.

The capping layers of Comparative sample devices 1 to 3 were removed on the following respective etching conditions.

| Comparative Sample device 1 | Immersed into the comparative etchant for about 10 seconds and conducting a plasma annealing process. |
| --- | --- |
| Comparative Sample device 2 | Immersed into the comparative etchant for about 20 seconds without a plasma annealing process. |
| Comparative Sample device 3 | Immersed into the comparative etchant for about 20 seconds and conducting a plasma annealing process. |

Effective oxide thicknesses (EOT) of the high-k layers and leakage currents were measured in each of the sample devices and the comparative sample devices.

Figure 36:
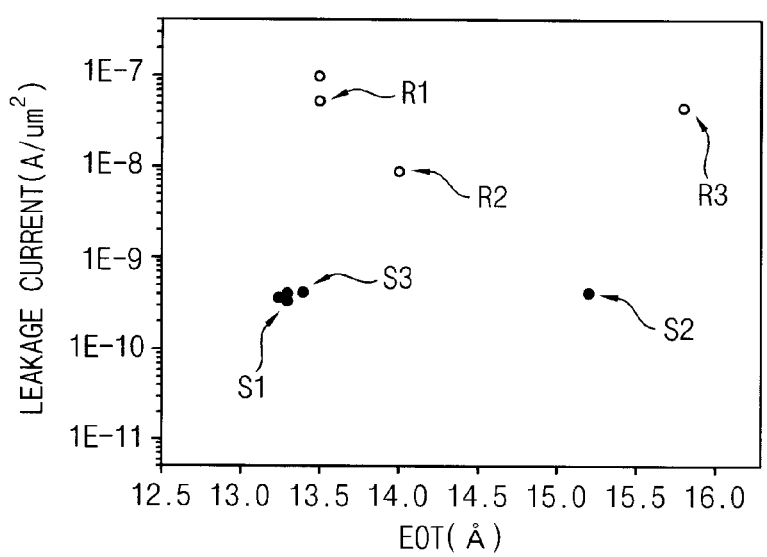
FIG. 36 is a graph showing the leakage currents measured in sample semiconductor devices and comparative sample semiconductor devices.

FIG. 36 is a graph showing the leakage currents measured in sample semiconductor devices and comparative sample semiconductor devices. In FIG. 36, S1 to S3 denotes Sample device 1, Sample device 2 and Sample device 3, respectively, and R1 to R3 denotes Comparative sample device 1, Comparative sample device 2 and Comparative sample device 3, respectively.

FIG. 36 shows that EOTs of Sample device 1 and Sample device 2 were similar to those of the comparative sample devices 1 and 2 were measured to about 13.4 Å. However, FIG. 36 also shows that the leakage current of Sample device 1 and Sample device 2 was 0.01 to 0.001 times the leakage current of the comparative sample devices 1 and 2.

In addition, the EOT of Sample device 3 was measured to about 15.25 Å, while the EOT of Comparative sample device 3 was measured to about 15.75 Å that was similar to EOT of the Sample device 3. However, the leakage current of Sample device 3 was 0.001 times the leakage current of Comparative sample devices 3.

That is, the removal of the capping layer using Etchant 3 may remarkably reduce the leakage current of Sample device 1, Sample device 2 and Sample device 3

Accordingly, the etching process for removing the capping layer may cause minimal or no damage to the high-k layer underlying the capping layer and thus the current leakage from the high-k layer may be sufficiently reduced in a semiconductor device.

According to the example of the present inventive concept, a pair of gate insulations of which the electric polarities are opposite to each other may be simultaneously formed on a substrate without any damage to a high-k layer caused by an etchant for removing a capping layer, thereby facilitating to control the threshold voltages of a CMOS transistor.

The foregoing is illustrative of example and is not to be construed as limiting thereof. Although a few example have been described, those skilled in the art will readily appreciate that many modifications are possible in the example without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various examples and is not to be construed as limited to the specific examples disclosed, and that modifications to the disclosed examples, as well as other examples, are intended to be included within the scope of the appended claims.

We claim:

1. A method of manufacturing a semiconductor device, comprising:
    forming a dielectric layer on a substrate having a first region and a second region;
    forming a capping layer on the dielectric layer; and
    forming a capping layer pattern by selectively etching the capping layer using an etchant from one of the first and the second regions of the substrate, the etchant including about 0.01 to 0.18 percent by weight of an acid, about 10 to 40 percent by weight of a fluoride salt, and a solvent.

2. The method of claim 1, wherein the dielectric layer includes any one material selected from the group consisting of hafnium oxide (HfOx), hafnium silicon oxide (HfSiO), hafnium silicon oxynitride (HfSiON), hafnium aluminum oxide (HfAlO), titanium oxide (TiOx), aluminum titanium oxide (AlTiO) and combinations thereof.

3. The method of claim 2, wherein the dielectric layer has a dielectric constant of at least about 10.

4. The method of claim 1, wherein the capping layer is etched at an etch rate at least 3 times greater than the etch rate of the dielectric layer.

5. The method of claim 4, wherein the etchant has an etch selectivity with respect to the dielectric layer such that the capping layer is etched at an etch rate at least 5 times greater than the dielectric layer.

6. The method of claim 5, wherein the etchant has an etch selectivity with respect to the dielectric layer such that the capping layer is etched at an etch rate at least 10 times greater than the dielectric layer.

7. The method of claim 1, wherein the etchant further includes about 0.01 to about 1 percent by weight of a surfactant.

8. The method of claim 1, wherein the acid includes any one selected from the group consisting of hydrochloric acid, sulfuric acid, nitric acid and phosphoric acid, fluoric acid and combinations thereof.

9. The method of claim 1, wherein the fluoride salt includes any one selected from the group consisting of potassium difluoride ($KHF_2$), ammonium fluoride ($NH_4F$), ammonium difluoride ($NH_4HF_2$), hydrogen fluoride pyridine and combinations thereof.

10. The method of claim 1, further comprising changing a composition of the dielectric layer underlying the capping layer pattern by a heat treatment to the capping layer pattern at one of the first and the second regions of the substrate, so that the dielectric layer includes a first dielectric layer of which the composition is unchanged at the first region of the substrate and a second dielectric layer of which the composition is changed by the heat treatment at the second region of the substrate.

11. The method of claim 10, wherein the composition of the second dielectric layer is changed by one of permeation from the capping layer pattern and reaction with the capping layer pattern.

12. The method of claim 11, further comprising:
    removing the capping layer pattern from the second dielectric layer;
    forming a gate electrode layer on the first and the second dielectric layers, the gate electrode layer including a metal nitride; and
    sequentially patterning the gate electrode layer, the first and the second dielectric layers, thereby forming a first gate structure on the first region of the substrate and a second gate structure on the second region of the substrate.

13. The method of claim 12, further comprising an insulation interlayer on the substrate, the insulation interlayer including a plurality of openings through which the substrate is partially exposed, wherein the first and the second gate structures are formed in the openings, respectively.

14. The method of claim 12, wherein the first region includes an NMOS region on which an N-channel MOS transistor is formed and the second region includes a PMOS region on which a P-channel MOS transistor is formed, and the capping layer includes any one material selected from the group consisting of aluminum nitride, aluminum oxide, dysprosium oxide, lanthanum oxide, silicon oxide and combinations thereof, so that the capping layer in the NMOS region is selectively removed and the capping layer pattern is formed in the PMOS region.

15. The method of claim 12, wherein the first region includes an NMOS region on which an N-channel MOS transistor is formed and the second region includes a PMOS region on which a P-channel MOS transistor is formed, and the capping layer includes lanthanum oxide, so that the capping layer in the PMOS region is selectively removed and the capping layer pattern is formed in the NMOS region.

16. The method of claim 1, further comprising, before forming the capping layer pattern, forming a photoresist pattern on the capping layer at one of the first and the second regions of the substrate.

17. The method of claim 16, further comprising:
    removing the photoresist pattern from the capping layer pattern; and
    changing a composition of the dielectric layer under the capping layer pattern by a heat treatment to the capping layer pattern at one of the first and the second regions of the substrate.

18. The method of claim 1, before forming the dielectric layer, further comprising forming an interface layer on the substrate, the interface layer including a material having a dielectric constant smaller than about 4.

19. The method of claim 1, wherein the capping layer includes one or more of aluminum nitride (AlNx), aluminum oxide (AlOx), dysprosium oxide (DyOx), and silicon oxide (SiOx).

* * * * *